(12) United States Patent
Na et al.

(10) Patent No.: US 11,755,104 B2
(45) Date of Patent: *Sep. 12, 2023

(54) EYE GESTURE TRACKING

(71) Applicant: Artilux, Inc., Menlo Park, CA (US)

(72) Inventors: Yun-Chung Na, Zhubei (TW);
Chien-Lung Chen, Taoyuan (TW);
Han-Din Liu, Sunnyvale, CA (US);
Shu-Lu Chen, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 314 days.

This patent is subject to a terminal disclaimer.

(21) Appl. No.: 17/007,958

(22) Filed: Aug. 31, 2020

(65) Prior Publication Data

US 2020/0401221 A1 Dec. 24, 2020

Related U.S. Application Data

(63) Continuation of application No. 15/359,460, filed on Nov. 22, 2016, now Pat. No. 10,761,599, which is a
(Continued)

(51) Int. Cl.
*G06T 7/514* (2017.01)
*G06F 3/01* (2006.01)
(Continued)

(52) U.S. Cl.
CPC .............. *G06F 3/013* (2013.01); *G06T 7/514* (2017.01); *G06T 7/74* (2017.01); *G06V 40/193* (2022.01);
(Continued)

(58) Field of Classification Search
CPC ......... H01L 27/14627; H01L 27/14625; H01L 27/14629; H01L 27/14636;
(Continued)

(56) References Cited

U.S. PATENT DOCUMENTS

| 3,621,466 A | 11/1971 | Toshio |
| 4,341,918 A | 7/1982 | Evans, Jr. et al. |

(Continued)

FOREIGN PATENT DOCUMENTS

| EP | 2224319 | 9/2010 |
| EP | 2330637 | 6/2011 |

(Continued)

OTHER PUBLICATIONS

Alsam et al.: "What the Eye Did Not See—A Fusion Approach to Image Coding", Advances in Visual Computing, dated Jan. 1, 2012, pp. 199-208 (with partial english translation).
(Continued)

*Primary Examiner* — Sumati Lefkowitz
*Assistant Examiner* — Michael Adam Shariff
(74) *Attorney, Agent, or Firm* — Fish & Richardson P.C.

(57) ABSTRACT

Methods, systems, and apparatus, including computer programs encoded on a computer storage medium, for eye gesture recognition. In one aspect, a method includes obtaining an electrical signal that represents a measurement, by a photodetector, of an optical signal reflected from an eye and determining a depth map of the eye based on phase differences between the electrical signal generated by the photodetector and a reference signal. Further, the method includes determining gaze information that represents a gaze of the eye based on the depth map and providing output data representing the gaze information.

20 Claims, 17 Drawing Sheets

Related U.S. Application Data continuation-in-part of application No. 15/228,282, filed on Aug. 4, 2016, now Pat. No. 9,954,016.

(60) Provisional application No. 62/363,179, filed on Jul. 15, 2016, provisional application No. 62/271,386, filed on Dec. 28, 2015, provisional application No. 62/251,691, filed on Nov. 6, 2015, provisional application No. 62/217,031, filed on Sep. 11, 2015, provisional application No. 62/211,004, filed on Aug. 28, 2015, provisional application No. 62/210,991, filed on Aug. 28, 2015, provisional application No. 62/210,946, filed on Aug. 27, 2015, provisional application No. 62/209,349, filed on Aug. 25, 2015, provisional application No. 62/200,652, filed on Aug. 4, 2015.

(51) Int. Cl.
 *H01L 27/146* (2006.01)
 *G06T 7/73* (2017.01)
 *G06V 40/18* (2022.01)

(52) U.S. Cl.
 CPC .... *H01L 27/1463* (2013.01); *H01L 27/14605* (2013.01); *H01L 27/14621* (2013.01); *H01L 27/14627* (2013.01); *H01L 27/14636* (2013.01); *H01L 27/14645* (2013.01); *H01L 27/14649* (2013.01); *H01L 27/14685* (2013.01); *H01L 27/14687* (2013.01); *H01L 27/14689* (2013.01); *G06T 2207/30201* (2013.01)

(58) Field of Classification Search
 CPC ......... H01L 27/14605; H01L 27/14612; H01L 27/14643; H01L 27/14607; H01L 27/14609; H01L 27/1461; H01L 27/14689; G02B 26/0816; G02B 27/0093; G02B 27/017; G02B 27/0172; G06T 7/74; G06T 7/50; G06T 7/514; G06T 2207/30201; G06T 2207/30041; G01N 2223/506; G06F 3/013; G06F 3/015; G06F 3/012; G06V 40/18; G06V 40/193; G06V 40/19; A61B 3/113; A61B 3/10
 See application file for complete search history.

(56) References Cited

U.S. PATENT DOCUMENTS

| | | | |
|---|---|---|---|
| 4,604,527 A | 8/1986 | Chenevas-Paula et al. |
| 4,607,168 A | 8/1986 | Oritsuki et al. |
| 4,767,936 A | 8/1988 | Muakami et al. |
| 4,782,376 A | 11/1988 | Catalano |
| 4,926,231 A | 5/1990 | Hwang et al. |
| 5,453,611 A | 9/1995 | Oozu |
| 5,673,284 A | 9/1997 | Congdon et al. |
| 5,965,875 A | 10/1999 | Merrill |
| 6,384,462 B1 | 5/2002 | Pauchard et al. |
| 6,483,130 B1 | 11/2002 | Yang et al. |
| 6,894,267 B2 | 5/2005 | Kakinuma |
| 6,958,194 B1 | 10/2005 | Hopper |
| 7,090,133 B2 | 8/2006 | Zhu |
| 7,411,265 B2 | 8/2008 | Sekiguchi |
| 7,456,874 B1 | 11/2008 | Ono |
| 7,557,368 B2 | 7/2009 | Hegarty et al. |
| 7,629,661 B2 | 12/2009 | Rafferty et al. |
| 7,750,958 B1 | 7/2010 | Dierickx |
| 7,826,058 B1 | 11/2010 | Ulrich et al. |
| 7,884,310 B2 | 2/2011 | Buettgen |
| 7,961,301 B2 | 6/2011 | Earhart et al. |
| 7,972,885 B1 | 7/2011 | Dutta et al. |
| 8,129,813 B2 | 3/2012 | Herz |
| 8,183,510 B2 | 5/2012 | Venezia et al. |
| 8,405,823 B2 | 3/2013 | Pfaff |
| 8,754,829 B2* | 6/2014 | Lapstun ................ G02B 26/10 |
| | | | 348/51 |
| 8,824,779 B1 | 9/2014 | Smyth |
| 8,860,083 B1 | 10/2014 | Trezza |
| 8,975,668 B2 | 3/2015 | Costello et al. |
| 9,236,520 B2 | 1/2016 | Okhonin |
| 9,239,626 B1 | 1/2016 | Wu et al. |
| 9,472,588 B1 | 10/2016 | Liu et al. |
| 9,635,351 B2 | 4/2017 | Dielacher et al. |
| 9,748,429 B1 | 8/2017 | Davids et al. |
| 9,893,112 B2 | 2/2018 | Na et al. |
| 10,418,407 B2 | 9/2019 | Na et al. |
| 10,436,883 B2* | 10/2019 | Sommer ................ G01S 17/36 |
| 10,564,718 B2 | 2/2020 | Na et al. |
| 2003/0042500 A1 | 3/2003 | Rhodes et al. |
| 2003/0189159 A1 | 10/2003 | Lnoue |
| 2004/0121507 A1 | 6/2004 | Bude et al. |
| 2005/0077588 A1 | 4/2005 | Kasuga |
| 2005/0167709 A1 | 8/2005 | Augusto |
| 2005/0186759 A1 | 8/2005 | So |
| 2005/0233495 A1 | 10/2005 | Yang et al. |
| 2006/0110844 A1 | 5/2006 | Lee et al. |
| 2006/0289957 A1 | 12/2006 | Morse et al. |
| 2007/0164767 A1 | 7/2007 | Herz |
| 2007/0187796 A1 | 8/2007 | Rafferty et al. |
| 2007/0218578 A1 | 9/2007 | Lee et al. |
| 2007/0218580 A1 | 9/2007 | Hsu et al. |
| 2008/0121866 A1 | 5/2008 | Yuan et al. |
| 2008/0157254 A1 | 7/2008 | Kang |
| 2008/0181452 A1 | 7/2008 | Kwon et al. |
| 2008/0303058 A1 | 12/2008 | Mori et al. |
| 2009/0242935 A1 | 1/2009 | Fitzgerald |
| 2009/0050891 A1 | 2/2009 | Katoh |
| 2009/0152604 A1 | 6/2009 | Zhu et al. |
| 2009/0166684 A1 | 7/2009 | Yahav et al. |
| 2009/0200589 A1 | 8/2009 | Qian et al. |
| 2009/0237770 A1 | 9/2009 | Kim et al. |
| 2010/0078680 A1 | 4/2010 | Cheng et al. |
| 2010/0102409 A1 | 4/2010 | Hansson |
| 2010/0184246 A1 | 7/2010 | Sakai |
| 2011/0031578 A1 | 2/2011 | Miura et al. |
| 2011/0102553 A1 | 5/2011 | Corcoran et al. |
| 2011/0109880 A1 | 5/2011 | Nummela |
| 2011/0128430 A1 | 6/2011 | Fossum |
| 2011/0155893 A1 | 6/2011 | Endo et al. |
| 2011/0181591 A1 | 7/2011 | Benitez |
| 2011/0188780 A1 | 8/2011 | Wang et al. |
| 2011/0255071 A1 | 10/2011 | Van Der Tempel et al. |
| 2011/0304696 A1 | 12/2011 | Centen et al. |
| 2012/0080726 A1 | 4/2012 | Sakano |
| 2012/0133922 A1 | 5/2012 | Pfaff |
| 2012/0241769 A1 | 9/2012 | Katoh |
| 2012/0248514 A1 | 10/2012 | Korekado et al. |
| 2012/0287085 A1 | 11/2012 | Yuki et al. |
| 2012/0307232 A1 | 12/2012 | Mase |
| 2013/0026548 A1 | 1/2013 | McCarten |
| 2013/0062506 A1 | 3/2013 | Hu |
| 2013/0062522 A1 | 3/2013 | Jiang et al. |
| 2013/0062663 A1 | 3/2013 | Yuan et al. |
| 2013/0075607 A1 | 3/2013 | Bikumandla et al. |
| 2013/0083003 A1* | 4/2013 | Perez ..................... G06T 11/20 |
| | | | 345/419 |
| 2013/0119234 A1 | 5/2013 | Lee et al. |
| 2013/0128070 A1 | 5/2013 | Ishikawa |
| 2013/0154918 A1 | 6/2013 | Vaught et al. |
| 2013/0248865 A1 | 9/2013 | Toriyama et al. |
| 2013/0278631 A1 | 10/2013 | Border et al. |
| 2013/0280879 A1 | 10/2013 | Stecher et al. |
| 2013/0283213 A1 | 10/2013 | Guendelman et al. |
| 2013/0321271 A1 | 12/2013 | Bychkov |
| 2014/0002700 A1 | 1/2014 | Oishi |
| 2014/0043227 A1 | 2/2014 | Skogo et al. |
| 2014/0054444 A1 | 2/2014 | Sasaki |
| 2014/0054736 A1 | 2/2014 | Meade et al. |
| 2014/0111664 A1 | 4/2014 | Kumano |
| 2014/0117428 A1 | 5/2014 | Lee et al. |
| 2014/0159129 A1 | 6/2014 | Wang |

(56) References Cited

U.S. PATENT DOCUMENTS

| | | |
|---|---|---|
| 2014/0183549 A1 | 7/2014 | Park et al. |
| 2014/0184496 A1 | 7/2014 | Gribetz et al. |
| 2014/0206443 A1 | 7/2014 | Sharp et al. |
| 2014/0252437 A1 | 9/2014 | Ho et al. |
| 2014/0285404 A1 | 9/2014 | Takano et al. |
| 2014/0285420 A1 | 9/2014 | Kamimma et al. |
| 2014/0285641 A1 | 9/2014 | Kato et al. |
| 2014/0312206 A1 | 10/2014 | Okhonin et al. |
| 2014/0367740 A1 | 12/2014 | Morse |
| 2014/0368613 A1 | 12/2014 | Krupka |
| 2015/0001664 A1 | 1/2015 | Van Der Tempel et al. |
| 2015/0014661 A1 | 1/2015 | Joo et al. |
| 2015/0022435 A1 | 1/2015 | Luebke |
| 2015/0041761 A1 | 2/2015 | Cheng et al. |
| 2015/0043826 A1 | 2/2015 | Ishimitus |
| 2015/0092983 A1 | 4/2015 | Nguyen et al. |
| 2015/0171146 A1 | 6/2015 | Ooki et al. |
| 2015/0193938 A1 | 7/2015 | Freedman et al. |
| 2015/0331508 A1 | 9/2015 | Nho et al. |
| 2015/0281618 A1 | 10/2015 | Saito |
| 2015/0286340 A1 | 10/2015 | Send et al. |
| 2016/0027837 A1 | 1/2016 | Webster et al. |
| 2016/0049476 A1 | 2/2016 | Rachmady et al. |
| 2016/0141329 A1 | 5/2016 | Cheng et al. |
| 2016/0150174 A1 | 5/2016 | Hynecek |
| 2016/0155883 A1 | 6/2016 | Shi et al. |
| 2016/0161599 A1 | 6/2016 | Seliuchenko |
| 2016/0172393 A1 | 6/2016 | Kim et al. |
| 2016/0187976 A1 | 6/2016 | Levesque et al. |
| 2016/0190304 A1 | 6/2016 | Morin et al. |
| 2016/0225922 A1 | 8/2016 | Akkaya et al. |
| 2016/0239974 A1 | 8/2016 | Wang |
| 2016/0284750 A1 | 9/2016 | Ionescu et al. |
| 2016/0316159 A1 | 10/2016 | Yoneda |
| 2016/0335475 A1 | 11/2016 | Krenzer et al. |
| 2016/0372502 A1 | 12/2016 | Li et al. |
| 2016/0381789 A1 | 12/2016 | Rogers et al. |
| 2017/0040361 A1 | 2/2017 | Ikeda et al. |
| 2017/0040362 A1 | 2/2017 | Na et al. |
| 2017/0062508 A1 | 3/2017 | Na et al. |
| 2017/0068319 A1 | 3/2017 | Viswanathan |
| 2017/0084648 A1 | 3/2017 | Liu et al. |
| 2017/0123233 A1 | 5/2017 | Sabovic |
| 2017/0131389 A1 | 5/2017 | Na et al. |
| 2017/0142362 A1 | 5/2017 | Liu |
| 2017/0177075 A1 | 6/2017 | Zhang |
| 2017/0196451 A1 | 7/2017 | Tian |
| 2017/0221212 A1 | 8/2017 | Adam et al. |
| 2017/0223339 A1 | 8/2017 | Kondo et al. |
| 2017/0237911 A1 | 8/2017 | Won |
| 2017/0244949 A1 | 8/2017 | Peterson |
| 2018/0006081 A1 | 1/2018 | Na et al. |
| 2018/0007255 A1 | 1/2018 | Tang |
| 2018/0012916 A1 | 1/2018 | Na et al. |
| 2018/0012917 A1 | 1/2018 | Na et al. |
| 2018/0012918 A1 | 1/2018 | Na et al. |
| 2018/0061883 A1 | 3/2018 | Na et al. |
| 2018/0137610 A1 | 5/2018 | Aflaki |
| 2018/0151732 A1 | 5/2018 | Mehandru et al. |
| 2018/0175084 A1 | 6/2018 | Na et al. |
| 2018/0175095 A1 | 6/2018 | Sallin et al. |
| 2018/0188356 A1 | 7/2018 | Na et al. |
| 2018/0190698 A1 | 7/2018 | Na et al. |
| 2018/0190702 A1 | 7/2018 | Na et al. |
| 2018/0233521 A1 | 8/2018 | Na et al. |
| 2018/0233528 A1 | 8/2018 | Na et al. |
| 2018/0247968 A1 | 8/2018 | Na et al. |
| 2018/0261645 A1 | 9/2018 | Na et al. |
| 2018/0269239 A1 | 9/2018 | Na et al. |
| 2019/0049564 A1 | 2/2019 | Na et al. |
| 2019/0103435 A1 | 4/2019 | Na et al. |
| 2019/0081095 A1 | 5/2019 | Hanzawa et al. |

FOREIGN PATENT DOCUMENTS

| | | | |
|---|---|---|---|
| JP | H0548139 | 2/1993 | |
| JP | 2000-133791 | 5/2000 | |
| JP | 2003-225207 | 8/2003 | |
| JP | 2004-103964 | 4/2004 | |
| JP | 2004-309701 | 11/2004 | |
| JP | 2005-123674 | 5/2005 | |
| JP | 2009-025225 | 2/2009 | |
| JP | 2009-047658 | 3/2009 | |
| JP | 2011-66097 | 3/2011 | |
| JP | 2011-128024 | 6/2011 | |
| JP | 2012-146920 | 8/2012 | |
| JP | 2015-194838 | 11/2015 | |
| KR | 20130100735 A * | 9/2013 | ............ H04N 13/00 |
| WO | WO 2005/036647 | 4/2005 | |
| WO | WO 2013/104718 | 7/2013 | |
| WO | WO 2014/085789 | 6/2014 | |
| WO | WO 2014/197226 | 12/2014 | |
| WO | WO 2015/104307 | 7/2015 | |
| WO | WO 2016/038416 | 3/2016 | |
| WO | WO 2016/077791 | 5/2016 | |
| WO | WO 2016/187566 | 11/2016 | |
| WO | WO 2016/208215 | 12/2016 | |
| WO | WO 2017/015580 | 1/2017 | |
| WO | WO 2017/018477 | 2/2017 | |
| WO | WO 2017/024121 | 2/2017 | |
| WO | WO 2017/035447 | 3/2017 | |

OTHER PUBLICATIONS

Bamji et al., "A 0.13 µm CMOS System-on-Chip for a 512 × 424 Time-of-Flight Image Sensor With Multi-Frequency Photo-Demodulation up to 130 MHz and 2 GS/s ADC," IEEE J. Solid-State Circuits, Jan. 2015, 50(1):303-319.

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-µm CMOS Technology," IEEE Trans. Electron. Dev., Jun. 2011, 58(6):1702-1709.

EP Search Report in European Application No. EP18189000, dated Jan. 9, 2019, 17 pages.

Extended European Search Report in European Application No. 16828622, dated Sep. 7, 2018, 6 pages.

Extended European Search Report in European Application No. 16833863, dated Jul. 18, 2018, 6 pages.

Extended European Search Report in European Application No. 16840192.5, dated Mar. 19, 2019, 7 pages.

Extended European Search Report in European Application No. 168630325, dated Aug. 23, 2018, 5 pages.

Extended European Search Report in European Application No. 181602004, dated Jul. 18, 2018, 6 pages.

Extended European Search Report in European Application No. 181602053, dated Jul. 18, 2018, 6 pages.

Extended European Search Report in European Application No. 181760315, dated Aug. 27, 2018, 6 pages.

Extended European Search Report in European Application No. 18189000.5. dated Apr. 2, 2019, 14 pages.

Fang et al., "An Integration PIN/MISS OEIC for High Current Photoreceiver Applications," IEEE Transactions on Electron Devices, Jan. 1997, 44(1):34-38.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fossum et al., "A Review of the Pinned Photodiode for CCD and CMOS Image Sensors," IEEE J. Electron Devices Soc. May 1, 2014, 2(3):33-43.

(56) References Cited

OTHER PUBLICATIONS

Geng, "Structured-light 3D surface imaging: a tutorial," Advances in Optics and Photonics, Jun. 30, 2011, 3(2):128-160.
Gulden et al., "Novel optical distance sensor based on MSM technology." IEEE Sensors Journal. Oct. 2004, 4(5):612-8.
Hutchinson et al., "High-Resolution Aliasing-Free Optical Beam Steering," Optica, vol. 3, No. 8, dated Aug. 5, 2016, 4 pages.
International Preliminary Report on Patentability in International Application No. PCT/US2016/043609, dated Jan. 23, 2018, 12 pages.
International Preliminary Report on Patentability in International Application No. PCT/US2016/045526, dated Feb. 6, 2018, 10 pages.
International Preliminary Report on Patentability in International Application No. PCT/US2016/048915, dated Feb. 27, 2018, 8 pages.
International Preliminary Report on Patentability in International Application No. PCT/US2016/060493, dated May 8, 2018, 11 pages.
International Preliminary Report on Patentability in International Application No. PCT/US2016/066073, dated Jul. 12, 2018, 7 pages.
International Search Report and Written Opinion in International Application No. PCT/US2016/043609, dated Nov. 1, 2016, 21 pages.
International Search Report and Written Opinion in International Application No. PCT/US2016/045526, dated Nov. 22, 2016, 15 pages.
International Search Report and Written Opinion in International Application No. PCT/US2016/048915, dated Nov. 22, 2016, 17 pages.
International Search Report and Written Opinion in International Application No. PCT/US2016/060493, dated Jan. 10, 2017, 20 pages.
International Search Report and Written Opinion in International Application No. PCT/US2016/066073, dated May 6, 2018, 16 pages.
International Search Report and Written Opinion in International Application No. PCT/US2018/020262, dated Jun. 6, 2018, 14 pages.
International Search Report and Written Opinion in International Application No. PCT/US2018/025949, dated Jul. 10, 2018, 14 pages.
International Search Report and Written Opinion in International Application No. PCT/US2018/027369, dated Jul. 31, 2018, 14 pages.
Joo et al., "High-sensitivity 10 Gbps Ge-on-Si photoreceiver operating at λ~1.55 pm," Optics Express, Aug. 2, 2010, 18(16):16474-16479.
Kato et al., "320 × 240 Back-Illuminated 10-μm CAPD Pixels for High-Speed Modulation Time-of-Flight CMOS Image Sensor," IEEE J. Solid-State Circuits Apr. 2018, 53(4):1071-1078.
Kawahito et al., "A CMOS Time-of-Flight Range Image Sensor With Gates-on-Field-Oxide Structure," IEEE Sensors J. Dec. 2007, 7(12):1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron. Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon. Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
PCT International Search Report and Written Opinion in International Appln. PCT/US19/19167, dated May 14, 2019, 15 pages.
Perenzoni et al., "Compact SPAD-Based Pixel Architectures for Time-Resolved Image Sensors," Sensors, May 23, 2016, 16(5):745, 12 pages.
Place et al., "Rad tolerant CMOS image sensor based on hole collection 4T pixel pinned photodiode." IEEE Transactions on Nuclear Science. Dec. 6, 2012, 59(6):2888-93.
Rafferty et a., "Monolithic germanium SWIR imaging array," 2008 IEEE Conference on Technologies for Homeland Security, Waltham, MA, May 12, 2008, p. 577-582.
Ramirez et al., "Recent progress on the quantum-dot avalanche photodiode," 22nd Annual Meeting of the IEEE Lasers and Electro-optics Society, Oct. 4, 2009, 2 pages.
Ringbeck et al., "Multidimensional measurement by using 3-D PMD sensors," Adv. Radio Sci., Jan. 1, 2007, 5:135-146.
Tseng et al., "High-performance silicon-on-insulator grating coupler with completely vertical emission," Sep. 21, 2015, 23(19):24433-9.
Tseng et al., "A self-assembled microbonded germanium/silicon heterojunction photodiode for 25 GB/s high-speed optical interconnects," Sci. Rep. Nov. 15, 2013, 3:3225, 6 pages.
Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J. Mar. 2007, 7(3):317-318.
Wu et al., "A critically coupled Germanium photodetector under vertical illumination," Opt. Express, Dec. 31, 2012, 20(28):29338-29346.
Yin et al., "31GHz Ge n-i-p waveguide photodetectors on Silicon-on-insulator substrate," Optics Express Oct. 17, 2007, 15(21):13965-13971.
Yokogawa et al., "IR sensitivity enhancement of CMOS Image Sensor with diffractive light trapping pixels," Sci. Rep. Jun. 19, 2017, 7(1):3832, 9 pages.
Zanuttigh et al.: "ToF Depth Camera Components", Time-of-Flight and Structmed Light Depth Cameras: Technology and Applications, dated May 24, 2016, pp. 31-33.

\* cited by examiner

EYE GESTURE TRACKING

CROSS-REFERENCE TO RELATED APPLICATION

This application is a continuation application of U.S. patent application Ser. No. 15/359,460, entitled "EYE GESTURE TRACKING," filed Nov. 22, 2016, which is a continuation-in-part application of U.S. patent application Ser. No. 15/228,282, entitled "GERMANIUM-SILICON LIGHT SENSING APPARATUS," filed Aug. 4, 2016, now U.S. Pat. No. 9,954,016 and claims the benefit of U.S. Provisional Application No. 62/363,179 filed on Jul. 15, 2016. U.S. patent application Ser. No. 15/228,282 claims the benefit of U.S. Provisional Patent Application No. 62/200,652, filed Aug. 4, 2015, U.S. Provisional Patent Application No. 62/209,349, filed Aug. 25, 2015, U.S. Provisional Patent Application No. 62/210,946, filed Aug. 27, 2015, U.S. Provisional Patent Application No. 62/210,991, filed Aug. 28, 2015, U.S. Provisional Patent Application No. 62/211,004, filed Aug. 28, 2015, U.S. Provisional Patent Application No. 62/217,031, filed Sep. 11, 2015, U.S. Provisional Patent Application No. 62/251,691, filed Nov. 6, 2015, and U.S. Provisional Patent Application No. 62/271,386, filed Dec. 28, 2015. These prior applications are incorporated by reference in their entirety.

BACKGROUND

The present specification relates generally to eye gesture tracking.

Light can be directed towards an eye and reflected light may be observed. The reflected light can be processed to determine information pertaining to the eye.

SUMMARY

In some implementations, a method of eye gesture tracking can be used to determine gaze information of an eye. The method of eye gesture tracking can include a demodulation of modulated optical signals that are reflected from the eye. The demodulated signals can be processed to generate a depth map of the eye and further determine the gaze information of the eye. The gaze information of the eye can include information representing, e.g., a pupil or an iris of the eye, which, in turn, can be used for various applications such as determining user preference data, controlling human-machine interaction apparatuses visually, providing cross-platform peripheral control, and the like. In addition, by tracking the eye gesture of the eye, corresponding eye gaze information can be used to refocus tunable optical elements in real time to alter light incident on the eye, creating for example nausea-free viewing experiences. The method of eye gesture tracking can also be used on various platforms to provide enhanced viewing experiences via dynamically refocused optical elements, providing for example three-dimensional (3D) foveated imaging.

One innovative aspect of the subject matter described in this specification is embodied in methods that include the actions of obtaining an electrical signal that represents a measurement, by a photodetector, of an optical signal reflected from an eye and determining a depth map of the eye based on phase differences between the electrical signal generated by the photodetector and a reference signal. Further, the methods can include the actions of determining a gaze information that represents a gaze of the eye based on the depth map and providing output data representing the gaze information.

Other implementations of this and other aspects include corresponding systems, apparatus, and computer programs, configured to perform the actions of the methods, encoded on computer storage devices.

Implementations may each optionally include one or more of the following features. For instance, the methods can include providing one or more filters to the optical signal reflected from the eye to remove non-target wavelength signals. Additionally, the methods can include providing one or more lenses to the optical signal reflected from the eye to focus the optical signal to the photodetector. The depth map can include one or more data sets of 3D information. The gaze information can include one or more of an identification of a particular region of the eye, an identification of a pupil of the eye, an identification of an iris of the eye, or an identification of a physiological structure of the eye. In some aspects, providing output data representing the gaze information includes providing the output data representing the gaze information as input data to another device, machine or system.

The methods can include determining an eye gesture based on the gaze information and providing output data representing the eye gesture. In this instance, the eye gestures can include one or more of a movement of the eye, a rotation of the eye, a steady state of the eye, a duration of the steady state of the eye, a closed state of the eye, a duration of the closed state of the eye, an open state of the eye, a duration of the open state of the eye, a blinking state of the eye, a duration of the blinking state of the eye, or a frequency of the blinking state of the eye. Further, providing output data representing the eye gesture can include providing the output data representing the gaze information as input data to another device, machine, or system.

In certain aspects, the optical signal reflected from the eye is generated by one or more optical sources that are biased by a modulated signal, the modulated signal being in sync with the reference signal. The methods can include generating an iris vector normal to a plane that is tangential to the eye and determining gaze information that represents a gaze of the eye based on the depth map and the iris vector. The methods can also include generating a pupil position of the eye on a plane that is tangential to the eye and determining gaze information the represents a gaze of the eye based on the depth map and the pupil position.

Another innovative aspect of the present disclosure can be embodied in a system including a machine with a display, the display including a plurality of tunable optical elements. The system can also include a device including circuitry configured to obtain an electrical signal that represents a measurement, by a photodetector, of an optical signal reflected from an eye. The circuitry can further be configured to determine a depth map of the eye based on phase differences between a reference signal and the electrical signal generated by the photodetector, and determine a gaze information that represents a gaze of the eye based on the depth map. Additionally, the system can include one or more processors in communication with the machine and the device, the one or more processors including one or more storage devices storing instructions that are operable, when executed by the one or more processors, to cause the one or more processors to perform the operations including receiving, from the device, output data representing the gaze information and determining the gaze information representing the gaze of the eye in relation to the display of the machine.

In some aspects, the operations can further include determining a particular position on the display that the eye is focused on, the particular position being based on the gaze information representing the gaze of the eye in relation to the display and providing an indication at the particular position on the display. The operations can include determining a particular position on the display that the eye is focused on, the particular position being based on the gaze information representing the gaze of the eye in relation to the display and providing a foveated image at the particular area on the display. The plurality of tunable optical elements can include tunable elements or tunable mirrors. In this instance, a tuning of a subset of the plurality of tunable optical elements is activated based on the gaze information representing the gaze of the eye in relation to the display. Further, the tuning of the subset of the plurality of tunable optical elements can include dynamically refocusing light incident on the subset of the plurality of tunable optical elements.

The system can include a wearable coupled to the machine, the device, and the one or more processors to form an integrated hardware package, the display of the machine being opaque in which visual images are shown on the display by one or more of an array of light sources. In certain aspects, the system can include a wearable coupled to the machine and the device to form an integrated hardware package, the display of the machine being opaque in which visual images are shown on the display by one or more of an array of light sources, and the one or more processors located at a remote location and in communication with the integrated hardware package via a wireless or wired connection. In other aspects, the system can include a wearable coupled to the machine, the device, and the one or more processors to form an integrated hardware package, the display of the machine being at least partly transparent to images projected towards the display, whereby a property of the images projected towards the display is modified by one or more of the plurality of tunable optical elements of the display.

Further, the system can include a wearable coupled to the machine and the device to form an integrated hardware package, the display of the machine being at least partly transparent to images projected towards the display, whereby a property of the images projected towards the display is modified by one or more of the plurality of tunable optical elements of the display, and the one or more processors located at a remote location and in communication with the integrated hardware package via a wireless or wired connection. The system can also include a pluggable coupled to the device and the one or more processors to form an integrated hardware package and the machine located at a remote location and in communication with the integrated hardware package via a wireless or wired connection, the display of the machine being opaque in which visual images are shown on the display by one or more of an array of light sources.

In some aspects, the system can include a wearable coupled to the device and the one or more processors to form an integrated hardware package and the machine located at a remote location and in communication with the integrated hardware package via a wireless or wired connection, the display of the machine being opaque in which visual image are shown on the display by one or more of an array of light sources. In this instance, the operations can further include determining a particular position on the display that the eye is focused on, the particular position being based on the gaze information representing the gaze of the eye in relation to the display and providing an indication at the particular position on the display. In certain aspects, the optical signal reflected from the eye is generated by an optical source that is biased by a modulated signal, the modulated signal being in sync with the reference signal.

Another innovative aspect of the present disclosure can be embodied in a device including a plurality of tunable optical elements for adjusting focal lengths. The wearable device can also include one or more processors including one or more storage devices storing instructions that are operable, when executed by the one or more processors, to cause the one or more processors to perform operations including, obtaining an electrical signal that represents a measurement, by a photodetector, of an optical signal reflected from an eye and determining a depth map of the eye based on phase differences between a reference signal and the electrical signal generated by the photodetector. The operations can further include determining gaze information that represents a gaze of the eye based on the depth map, the gaze information representing the gaze of the eye in relation to a display of a remote device and activating a tuning of a subset of the plurality of tunable optical elements based on the gaze information.

Advantageous implementations can include one or more of the following features. The eye gesture tracking methods of the present disclosure can be used to provide cross-platform peripheral control. The cross-platform peripheral control can be used to exchange information between multiple devices. The exchanged information can include eye gesture information, commands that correspond to the eye gesture information, gaze positions of an eye, and the like. This cross-platform peripheral control can be utilized to extend the operation regions in comparison to traditional eye tracking schemes. As such, the eye gesture tracking methods of the present disclosure provide greater operation regions that are not constrained as the traditional eye tracking schemes are, due to limited detection regions and localization of the traditional eye tracking schemes to only a specific device. Moreover, more than one user may apply the cross-platform peripheral control to the multiple devices at the same time, so that a user-to-user interaction can be effectively created.

Additionally, the eye gesture tracking methods of the present disclosure can be used to provide nausea-free viewing experiences. In certain aspects, the eye gesture tracking information can be used in optical systems that utilize tunable optical elements to refocus images according to the eye gesture tracking information and a known distance information. The tunable optical elements adjust angles of eye-incident light to provide real-time focusing. The real-time focusing based on the eye gesture tracking methods of the present disclosure can reduce feelings of nausea by maintaining consistent depth perception between the user's eye and brain. Moreover, the eye gesture tracking information may be used to control a subset of the tunable optical elements creating a foveated focusing, where focal lengths for various regions in an image that is presented to a viewer may be controlled to be different. The foveated focusing of the present disclosure provides a natural 3D effect via simple tunable optics, unlike the traditional foveated rendering providing an artificial 3D effect via complicated computational algorithms.

The details of one or more embodiments of the invention are set forth in the accompanying drawings and the descrip-

BRIEF DESCRIPTION OF THE DRAWINGS

Like reference numbers and designations in the various drawings indicate like elements.

DETAILED DESCRIPTION

Figure 1A:
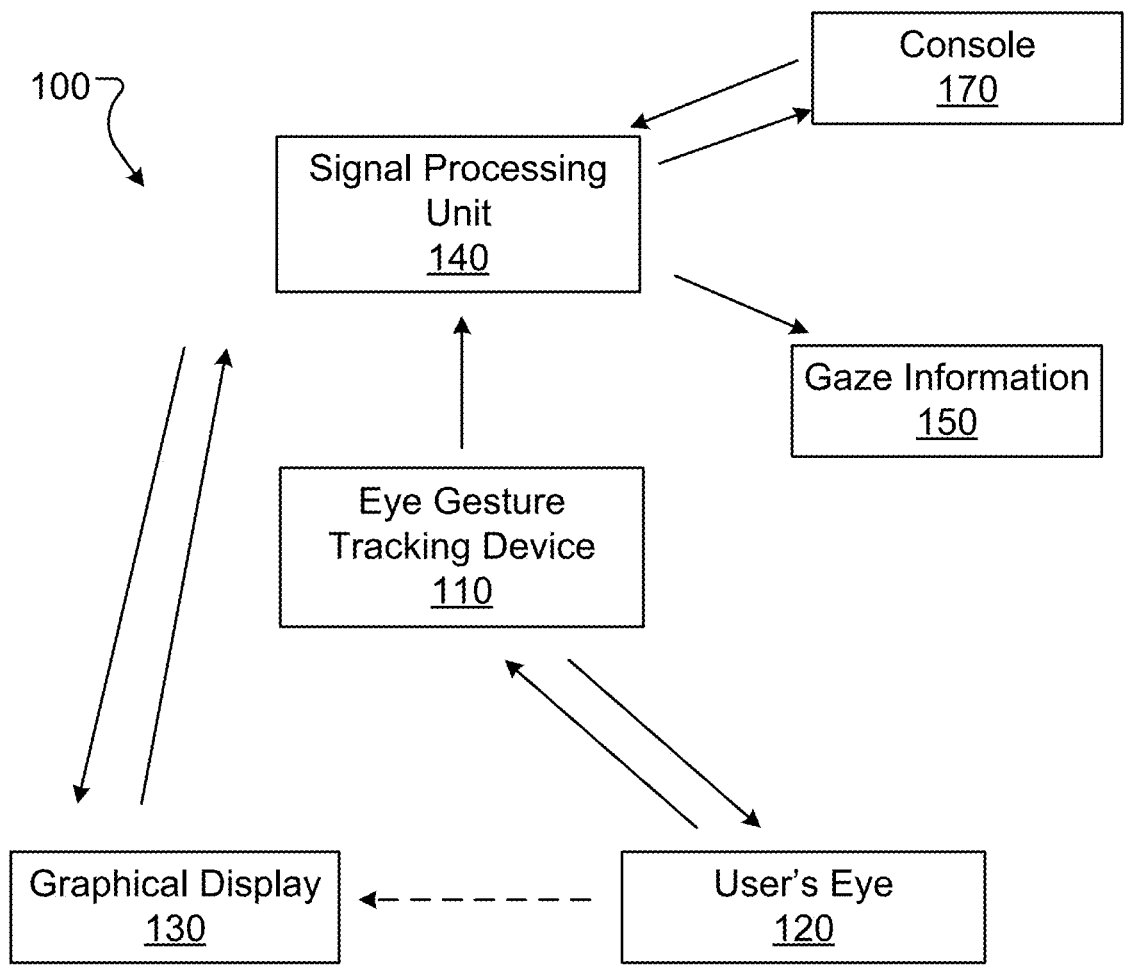
FIG. 1A is an exemplary illustration of an eye gesture tracking system.

Methods of eye gesture tracking can be used to determine gaze information pertaining to a tracked eye. The methods can include illuminating an eye and detecting reflected optical signals from the eye, to track a gaze direction and a focus of the eye. Determination of the gaze direction and the focus of the eye can be useful in communicating with another device. For example, the gaze information of the eye can be used to provide one or more commands to another device. In some implementations, the gaze information and/or other information like hand gestures can be detected by the system described herein embedded in a cell phone, and the cell phone can be used as a remote control that receives the commands from the user and connects to other devices such as tablet, television and etc. to execute the commands. In certain implementations, the gaze information can include gestures of the eye. As such, eye gestures such as eye movement, eye rotation, eye state, and the like, can be used to indicate certain commands to be provided to another device. In some implementations, the gaze information of the eye can be used to determine the location of the eye's focus, such as where the eye is focused at a particular display. In this instance, the location of the eye's focus with respect to the display can be used to gather information indicating a user's interests. For example, if an advertisement is provided at the display, the focus of the user's eye with respect to the location of the advertisement being provided at the display can be used to determine what the user is interested in. As such, the location of an eye gaze, and for example the length of time the eye holds that particular gaze, can be helpful in determining the user's interest levels for contents being provided at the particular display.

In some implementations of the present disclosure, the methods of eye gesture tracking can be integrated into wearables and/or peripheral devices. For example, a wearable device can be used to provide illumination at an eye, and detect the reflected optical signals of the eye. The wearable device can include components such as an accelerometer, a gyroscope, or both, to aid in the tracking of the eye and the focus of the eye at a particular display so that the eye gestures can be tracked efficiently and persistently. In certain implementations, the wearable device can further include tunable optical elements for light path adjustments. The tunable optical elements can include mirrors and/or lenses that are adjusted based on the movement, or lack thereof, of the tracked eye. The tunable optical elements can be used to provide dynamic focusing and defocusing in real time to aid in the eye's viewing of a particular object or display. For example, the tunable optical elements can be used to solve inconsistencies between accommodation and vergence when viewing images at a virtual reality (VR) or augmented reality (AR) display. In certain implementations, the components of the wearable device can be implemented externally in a remote device that is separate from the wearable device. The methods of eye tracking can be used to provide data particular to the eye gaze as output and use this output to provide commands at remote devices and/or tunable optical elements to aid in various viewing experiences.

FIG. 1A is an exemplary illustration of an eye gesture tracking system 100. The eye gesture tracking system 100 can be used to process information of a user's eye in response to generating a depth map of the eye. The eye gesture tracking system 100 includes an eye gesture tracking device 110 for tracking movement of a user's eye 120, a graphical display 130, a signal processing unit 140 for processing eye data detected at the eye gesture tracking device 110, and optionally a console 170 providing additional user input to the system depending on the nature of the application. The user's eye 120 can include one or both eyes of a user that is viewing the graphical display 130.

The graphical display 130 can be one or more graphical displays on a computer, laptop, desktop, television, smart phone, tablet and the like. The graphical display 130 can include a liquid crystal display (LCD), a light emitting diode (LED) display, an organic light emitting diode (OLED) display, a head mounted display (HMD) and the like. In some implementations, the graphical display 130 can include tunable optical elements such as a mirror and/or a tunable lens. In this instance, the tunable optical elements of the graphical display 130 can be configured to adjust focusing as well as defocusing in real time to aid the user's eye 120 in viewing the graphical display 130.

The eye gesture tracking device 110 can include one or more eye gesture tracking devices in communication with the signal processing unit 140. The eye gesture tracking device 110 can provide illumination at the user's eye 120 and receive reflected optical signals of the user's eye 120. The eye gesture tracking device 110 can include a modulated optical source that illuminates the user's eye 120 at one or more selected wavelengths. The modulated optical source can include a single optical emitter or multiple optical emitters modulated by a radio-wave frequency (RF) or a microwave frequency voltage source providing the illumination. In some implementations, the optical emitters can be used to illuminate the entirety of the user's eye 120. In other implementations, the optical emitters can be used to illuminate selected portions of the user's eye 120. The one or more wavelengths used in the eye gesture tracking system 100 can be predetermined based on various criteria, for example, non-pervasiveness to the human eye, low solar irradiance at sea level, eye safety, and the like.

In some implementations, the eye gesture tracking device 110 can include one or more photodetectors for receiving the reflected optical signals of the user's eye 120. The reflected optical signals of the user's eye 120 can be reflections of the modulated optical signals provided by the eye gesture tracking device 110. In certain implementations, the eye gesture tracking device 110 can detect the reflected, modulated optical signals by the one or more photodetectors. The photodetectors may be implemented by the techniques described in U.S. patent application Ser. No. 15/338,660 titled "High-Speed Light Sensing Apparatus," filed October 31, and U.S. patent application Ser. No. 15/228,282, entitled "GERMANIUM-SILICON LIGHT SENSING APPARATUS," filed Aug. 4, 2016.

The signal processing unit 140 can include one or more signal processing units in communication with the graphical display 130 and the eye gesture tracking device 110. The signal processing unit 140 can be configured to determine gaze information 150 of the user's eye 120 via data corresponding to the eye gesture tracking device 110 and the graphical display 130. The eye gesture tracking device 110 can be configured to demodulate the reflected, modulated optical signals. Further, the eye gesture tracking device 110 can be configured to create a depth map of the illuminated portions of the user's eye 120. The depth map can correspond to the reflected optical signals that are detected by the photodetectors of the eye gesture tracking device 110. Specifically, the depth map can provide two-dimensional (2D) and three-dimensional (3D) information pertaining to the user's eye 120. The signal processing unit 140 can process the depth map according to data representing the time-of-flight information of the reflected optical signals. In some implementations, the depth map can be based on phase differences between the reflected optical signals and a reference signal. For example, the eye gesture tracking device 110 can provide a comparison between the reflected optical signals and a reference signal, and can be used to determine the depth map of the user's eye 120. The depth map can further include a 3D model representing the user's eye 120. As such, the 3D eye model can be generated and constructed, thereby allowing the signal processing unit 140 to determine the gaze information 150 of the user's eye 120.

The signal processing unit 140 can be located near the user's eye 120. For example, the signal processing unit 140 and the eye gesture tracking device 110 can be implemented in a single wearable device located at a nearby location close to the user's eye 120. The signal processing unit 140 and the eye gesture tracking device 110 can also be implemented in a single peripheral device located at a remote location away from the user's eye 120. In other implementations, the signal processing unit 140 can be located separately from the eye gesture tracking device 110. For instance, the signal processing unit 140 can be located at the graphical display 130 and be in communication with the eye gesture tracking device 110 implemented in a single wearable or peripheral device.

The gaze information 150 can include information such as the user's eye gaze direction and focus. The gaze information 150 can be determined by the signal processing unit 140 with respect to the optical signals received by the eye gesture tracking device 110. The gaze information 150 can be used to analyze the user's eye behavior. Further, the gaze information 150 can be used to identify a location of the user's eye's 120 focus with respect to the display 130. In this instance, the gaze information 150 can be used to determine particular items displayed at the display 130 that the user's eye 120 is focused at. Thus, a user's interests can be determined without the need for physical actuation of a particular device. For example, ad providers can determine the interests of a user based exclusively on the user's eye 120, without the need for activation/detection via a computer mouse, computer trackpad, touch screen, or the like. In other instances, physical actuation of particular devices may be used to perform certain functions of the user and system interaction. Utilizing such devices may become advantageous for the efficiency as the complexity of the interaction between the system and the user increases. For example, fighter jet pilots may utilize eye gaze information 150 to identify/select targets of interest on the display 130 and use console 170 to perform tasks on the target of interest such as target acquisition, target priority assignment, weapons selection, and etc.

In some implementations, the gaze information 150 can be used to indicate commands to be provided to another device. In this instance, the gaze information 150 can include eye gestures such as eye movement, eye rotation, a closed-state of the eye, an open-state of the eye, any duration thereof, and the like. The device that receives the gaze information 150 may analyze the gaze information 150 in real time to determine a command as the user's eye 120 is being dynamically tracked by the eye gesture tracking device 110.

The eye gesture tracking device 110, the graphical display 130, and the signal processing unit 140 can be independent structures, or coupled together in an integrated hardware package. For example, the eye gesture tracking device 110, the graphical display 130, and the signal processing unit 140 can be integrated in a single hardware package in which the display of the graphical display 130 is opaque and visual images are shown on the display by an array of light-emitting diodes generating visible light, liquid crystals filtering white light, or any other array of light sources. In some implementations, the display of the graphical display 130 is at least partly transparent and visual images are projected to the display by optical refraction, diffraction, reflection, guiding or other optical means.

In another example, the eye gesture tracking device 110 and the signal processing unit 140 can be integrated in a single hardware package such as a wearable device. A wearable device may be a headset, a pair of glasses, or any other suitable wearable device. In this instance, the wearable device communicates with a main frame or a machine in which the graphical display 130 is embedded. Further, the main frame or the machine containing the graphical display 130 can be in communication with the wearable device via a wireless or wired connection.

In another example, the eye gesture tracking device 110 and the signal processing unit 140 can be integrated in a single hardware package such as a pluggable device. A pluggable device may be a game box, a camcorder, or any other suitable pluggable device. In this instance, the pluggable device communicates with a main frame or a machine in which the graphical display 130 is embedded. Further, the main frame or the machine containing the graphical display 130 can be in communication with the pluggable device via a wireless or wired connection.

Figure 1B:
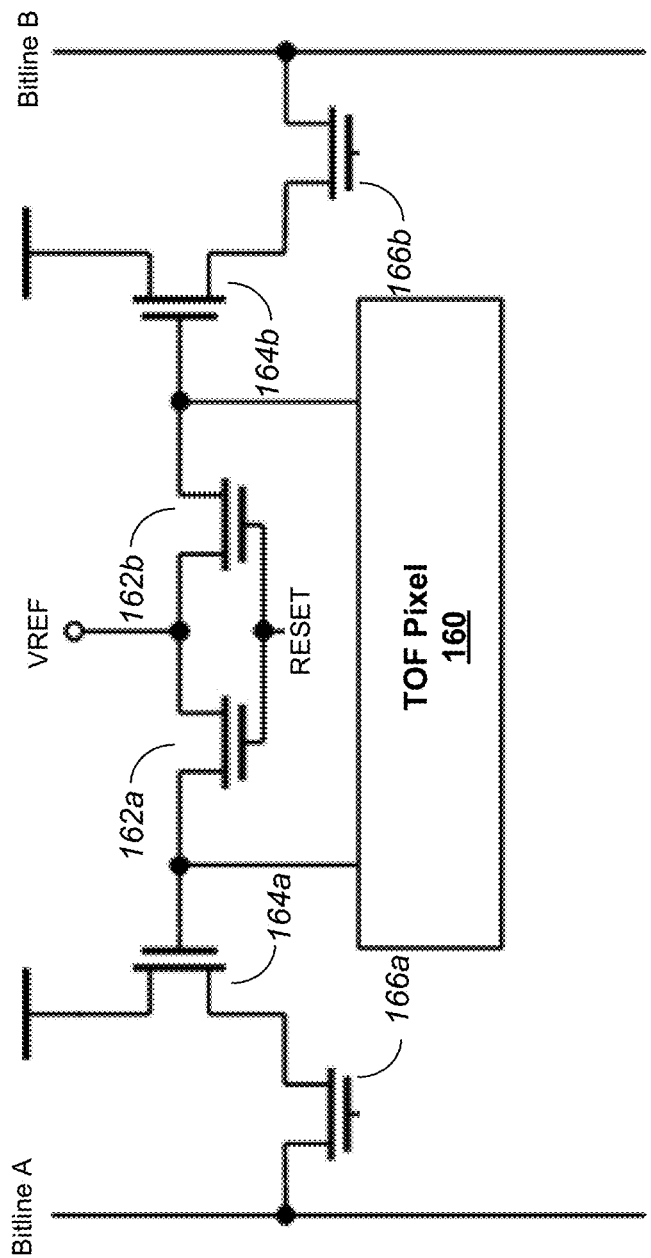
FIG. 1B is an exemplary illustration of a time-of-flight device.

FIG. 1B is an exemplary illustration of a time-of-flight device. The time-of-flight device can be integrated into the eye gesture tracking device 110 and can be used to determine the depth map of the user's eye 120. The time-of-flight device of FIG. 1B includes a time-of-flight (TOF) pixel 160 and two sets of transistors. As illustrated in FIG. 1B, each set of the transistors can include three switch transistors (3T), i.e., a reset transistor 162a or 162b, a source-follower transistor 164a or 164b, and a selection transistor 166a or 166b. In some other implementations, other arrangements of transistors may be used to achieve similar functionalities. The TOF pixel 160 can be one or more TOF pixels that are used to detect light. As light is detected by the TOF pixel 160, the TOF pixel determines whether charge should be processed by the first set of transistors or the second set of transistors. In some aspects, a received light signal may be out of phase with respect to an emitted light signal. In this instance, the TOF pixel can be designed to be a dual switching TOF pixel so that one switch is modulated in phase and the other switch is modulated 180 degrees out of phase with respect to the emitted light signal to accommodate the received, out of phase, light signal. The dual switching TOF pixel may be implemented by the techniques described in U.S. patent application Ser. No. 15/338,660 titled "High-Speed Light Sensing Apparatus," filed October 31, and U.S. patent application Ser. No. 15/228,282, entitled "GERMANIUM-SILICON LIGHT SENSING APPARATUS," filed Aug. 4, 2016.

In certain aspects, the two sets of transistors can be fabricated with the TOF pixel 160 on a single wafer. In this instance, the two sets of transistors may share and occupy the same light illumination area as the TOF pixel 160 does, thereby reducing an active fill factor of the TOF device. The two sets of transistors may be implemented by NMOS gates. NMOS gates are utilized to reduce the size of the transistors and so the TOF device. The two sets of transistors may also be implemented by PMOS gates. PMOS gates are utilized to increase certain operation parameters such as providing a greater usable voltage headroom. The PMOS and NMOS implementations of the sets of transistors will be discussed further herein.

Figure 1C:
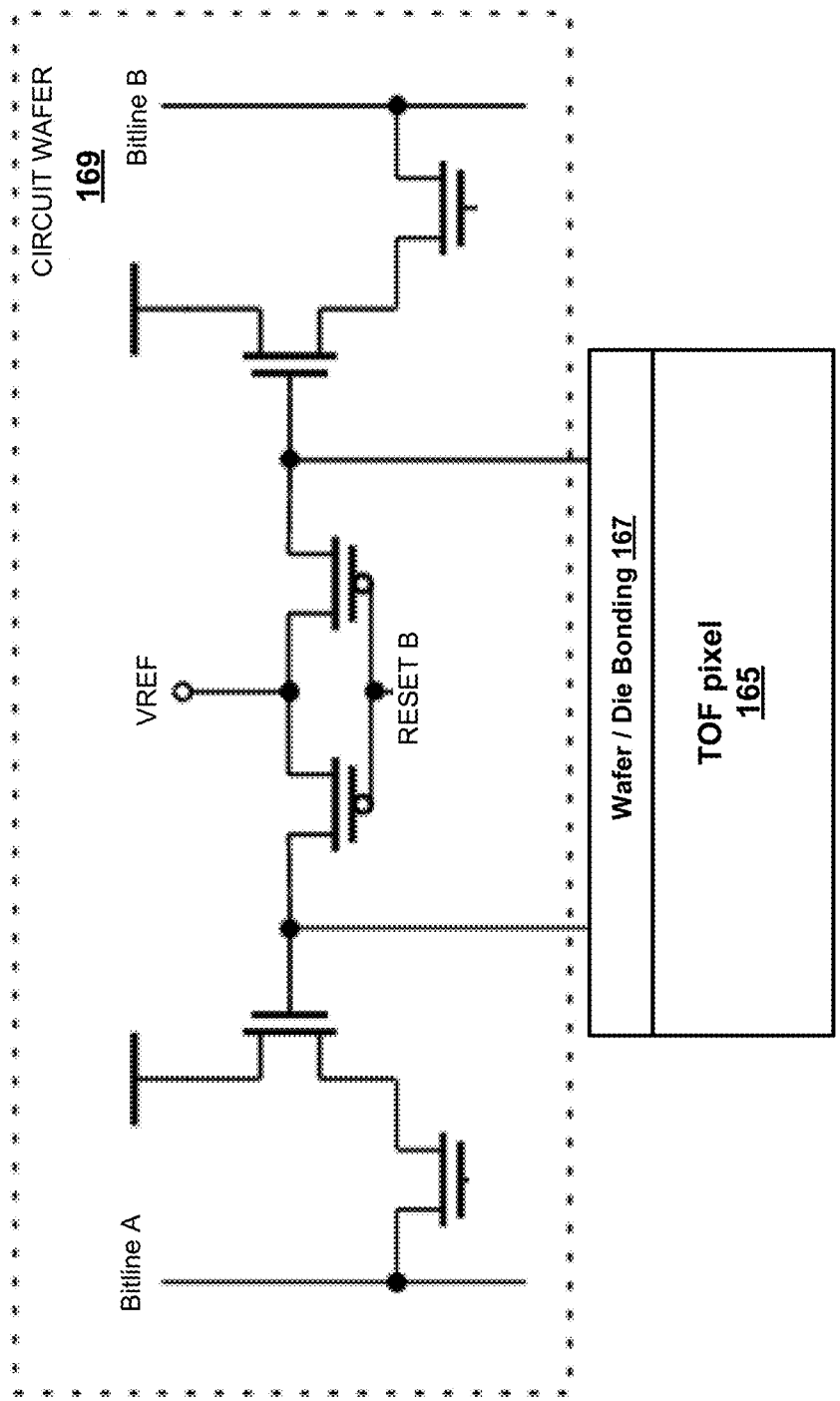
FIG. 1C is an exemplary illustration of a time-of-flight device.

FIG. 1C is an exemplary illustration of a time-of-flight device. The TOF device of FIG. 1C includes a first wafer and a second wafer that are bonded together via die or wafer bonding 167. The first wafer can include a TOF pixel 165 that is fabricated on the first wafer. The TOF pixel 165 can be used to detect light pulse information. The second wafer can be a circuit wafer 169 that includes two sets of transistors. The circuit wafer 169 can be used to process charge as light pulse information is detected at the TOF pixel 165. In certain implementations, the transistors of the circuit wafer 169 do not occupy the light illumination area, thereby increasing the active fill factor of the TOF device.

The two sets of transistors can be implemented by NMOS or PMOS gates. For example, each of the two set of transistors can be implemented by NMOS gates with a threshold voltage of 0.7 Volts. In this instance, when the gate voltage is supplied with 3.3 Volts, a maximum source voltage of about 2.6 Volts can be obtained while the NMOS gate is on. Consequently, when NMOS is used as a reset transistor, the reset voltage applied to the TOF pixel can only be as high as 2.6 Volts that results into a smaller voltage headroom. In comparison, another example may include each of the two set of transistors implemented by PMOS gate with a negative threshold voltage of −0.8 Volts. In this instance, when the gate voltage is supplied with 0 Volts, a maximum source voltage of about 3.3 Volts can be obtain while the PMOS gate is on. Consequently, when PMOS is used as a reset transistor, the reset voltage applied to the TOF pixel can be as high as 3.3 Volts that results into a larger voltage headroom.

Thus, the two sets of transistors can yield a greater usable voltage headroom when implemented by PMOS gates. This aspect of the PMOS implementation can be attributed in part to the negative threshold voltage. Further, the PMOS implementation can yield a smaller impedance when it turns on as a switch and passes a voltage that its value is close to a supply voltage. As such, the PMOS implementation of the two sets of transistors provide operation benefits of the TOF device, however, the physical area of the PMOS gate is larger than that of the NMOS gate and so the PMOS implementation requires a physically larger TOF device to provide such implementation. This issue can be resolved, as shown in FIG. 1C, when the TOF pixel and the PMOS circuit are implemented on two separate wafers, followed by a wafer or die bonding to electrically connect the two separate wafers or dies. In some implementations, the TOF pixel as shown in FIGS. 1B and 1C may include a light absorption layer including germanium. In some implementations, the TOF pixel as shown in FIGS. 1B and 1C further includes a demodulation function implemented by dual switching transistors or multiple PN junctions to achieve the demodulation function. The dual switching TOF pixel may be implemented by the techniques described in U.S. patent application Ser. No. 15/338,660 titled "High-Speed Light Sensing Apparatus," filed October 31, and U.S. patent application Ser. No. 15/228,282, entitled "GERMANIUM-SILICON LIGHT SENSING APPARATUS," filed Aug. 4, 2016.

Figure 1D:
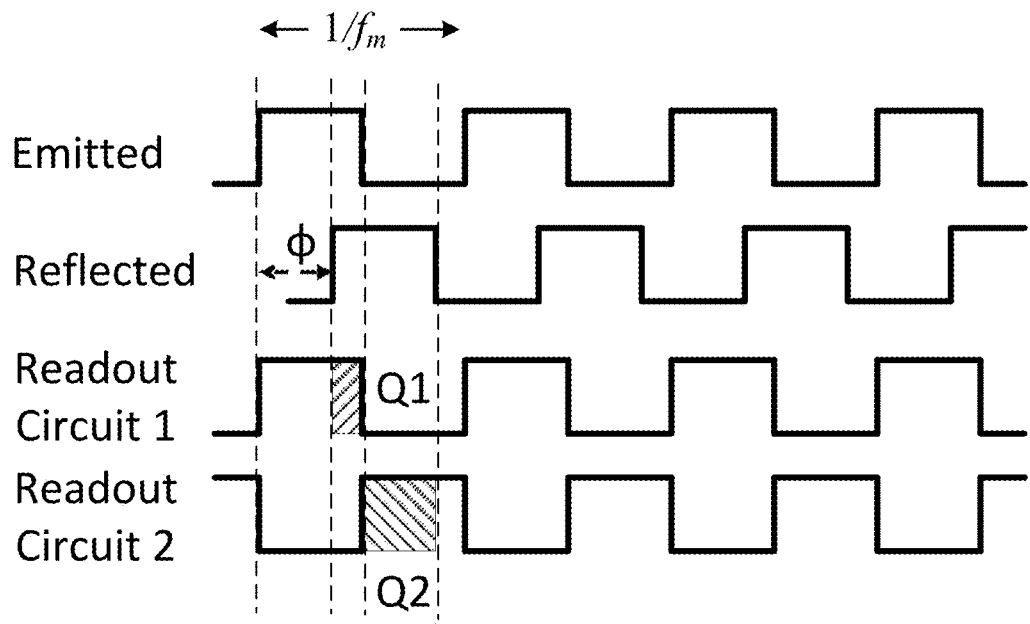
FIGS. 1D and 1E are example techniques for determining characteristics of a user's eye.

FIG. 1D shows one example technique for determining characteristics of the user's eye 120. The eye gesture tracking device 110 may emit light pulses modulated at a frequency $f_m$ with a duty cycle of 50%. The eye gesture tracking device 110 may receive reflected light pulses having a phase difference $\Phi$. A photodiode array may be controlled such that a readout circuit 1 reads the collected charge $Q_1$ in a phase synchronized with the emitted light pulses, and a readout circuit 2 reads the collected charge $Q_2$ in an opposite phase with the emitted light pulses. In some implementations, the distance, D, between the eye gesture tracking device 110 and one point of the user's eye 120 may be derived using the equation $$D = \frac{c}{4f_m} \frac{Q_2}{Q_1 + Q_2}, \tag{1}$$

where c is the speed of light. The eye gesture tracking device 110 may scan the user's eye 120 to obtain a depth profile of the user's eye 120.

Figure 1E:
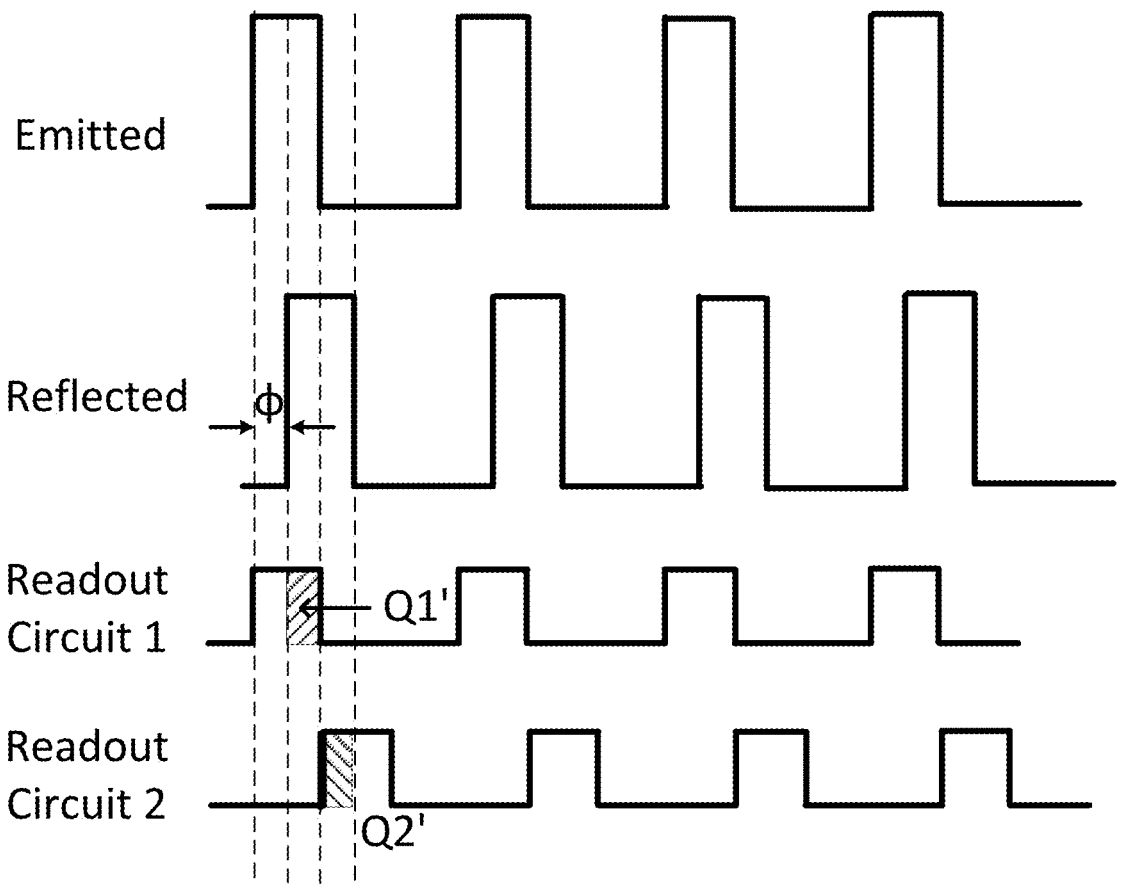

FIG. 1E shows another example technique for determining characteristics of the user's eye 120. The eye gesture tracking device 110 may emit light pulses modulated at a frequency $f_m$ with a duty cycle of less than 50%. By reducing the duty cycle of the optical pulses by a factor of N, but increasing the intensity of the optical pulses by a factor of N at the same time, the signal-to-noise ratio of the received reflected light pulses may be improved while maintaining substantially the same power consumption for the eye gesture tracking device 110. This is made possible when the device bandwidth is increased so that the duty cycle of the optical pulses can be decreased without distorting the pulse shape. The eye gesture tracking device 110 may receive reflected light pulses having a phase difference Φ. The photodiode diode may be controlled such that a readout circuit 1 reads the collected charge $Q_1'$ in a phase synchronized with the emitted light pulses, and a readout circuit 2 reads the collected charge $Q_2'$ in a delayed phase with the emitted light pulses. In some implementations, the distance, D, between the eye gesture tracking device 110 and a point of the user's eye 120 may be derived using the equation $$D = \frac{c}{4Nf_m} \frac{Q_2'}{Q_1' + Q_2'}. \tag{2}$$

Figure 1F:
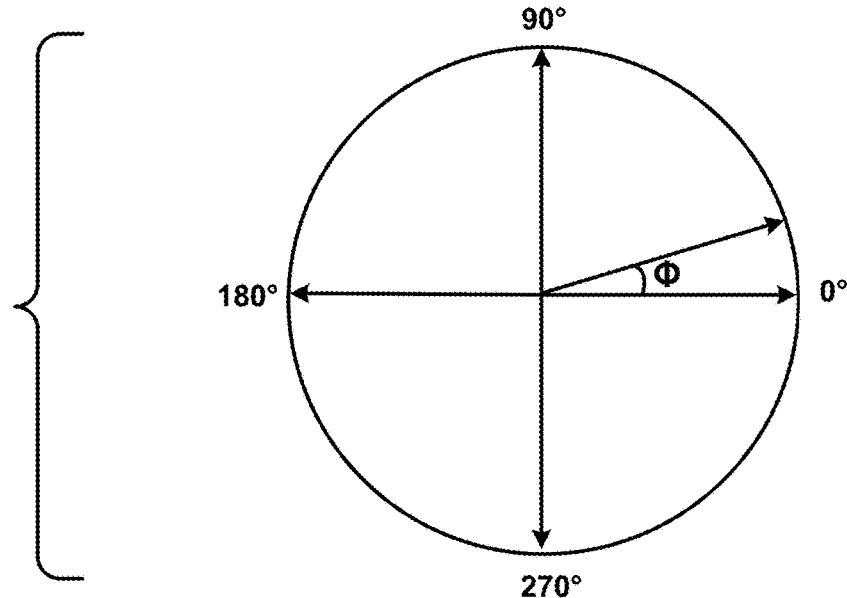
FIG. 1F is an exemplary illustration of phases for charge collection.

FIG. 1F is an exemplary illustration of phases for charge collection. The phases for charge collection represent phases in which light pulses are emitted and electrical charge are collected by the eye gesture tracking device 110. The phases for charge collection include a 0 degree phase, a 90 degree phase, a 180 degree phase, and a 270 degree phase, and a controllable phase shift φ. The phase difference Φ may be observed between light pulses emitted by the eye gesture tracking device 110 and light pulses received by the eye gesture tracking device 110. In some implementations, the phase difference Φ occurs due to a distance between the user's eye 120 and the eye gesture reading device 110. A small phase difference can make it difficult for the eye gesture tracking device 110 to efficiently detect a gesture recognition of the user's eye 120, a mapping of the user's eye 120, and the like. As such, it can be beneficial to add a phase shift φ to the collected charge so that the eye gesture recognition can be performed efficiently.

Figure 1G:
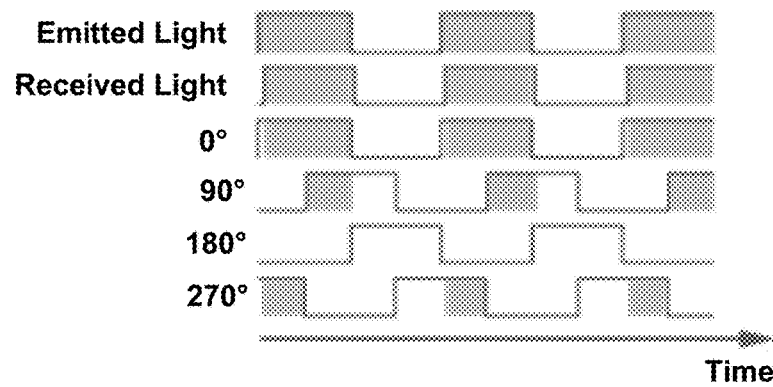
FIG. 1G is an exemplary illustration of light emission, detection and charge collection.

FIG. 1G is an exemplary illustration of light detection and charge collection. The light detection and charge collection includes time steps of light emission, light detection, and charge collection at the eye gesture reading device 110. At each of the time steps, data are collected to represent the received light, the charge collected at the 0 degree phase, the charge collected at the 90 degree phase, the charge collected at the 180 degree phase, and the charge collected at the 270 degree phase. The collection of charge at each phase can indicate an amount of collected charge at each of the received phases. In this instance, the amount of collected charge at each time step of each phase can impact an accuracy of the eye gesture reading device 110 in mapping the user's eye 120.

For example, the eye gesture tracking device 110 may emit light pulses modulated at a frequency $f_m$ with a duty cycle of 50%. The eye gesture tracking device 110 may receive reflected light pulses having a phase difference Φ. The TOF pixels can be controlled such that a first readout circuit of the eye gesture tracking device 110 reads the collected charge, Q0, at a phase that is synchronization with the emitted light pulses, thus corresponding to the 0 degree phase. The eye gesture tracking device 110 can also include a second readout circuit that reads the collected charge, Q180, at an opposite phase of the emitted light pulses, such as the 180 degree phase. In another time step, the TOF pixels are controlled such that first readout circuit reads the collected charge, Q90, in a quadrature phase with respect to the emitted light pulses, such as the 90 degree phase. In this instance, the second readout circuit can read the collected charge, Q270, in the other quadrature phase with respect to the emitted light pulses, such as the 270 degree phase. In some implementations, the distance between the eye gesture tracking device 110 and the user's eye 120 may be derived using the following two equations:

$$D = \frac{c}{8f_m}\left(1 + \frac{Q180 - Q0}{|Q0 - Q180| + |Q90 - Q270|}\right), \text{ or} \tag{3}$$

$$D = \frac{c}{8f_m}\left(3 + \frac{Q0 - Q180}{|Q0 - Q180| + |Q90 - Q270|}\right). \tag{4}$$

Referring again to FIG. 1G, in a condition of the small phase difference Φ between light pulses emitted by the eye gesture tracking device 110 and light pulses received by the eye gesture tracking device 110, the charge collection at the 0 degree phase is the greatest over the provided time steps, and the charge collection at the 180 degree phase is the lowest over the provided time steps. Such a large difference in charge collection can impact the accuracy of the charge collection as a whole. Thus, introducing phase shift φ can be helpful in eye gesture detection by reducing the differences in charge collection at each phase to enable a more accurate depth map of the user's eye 120.

Figure 1H:
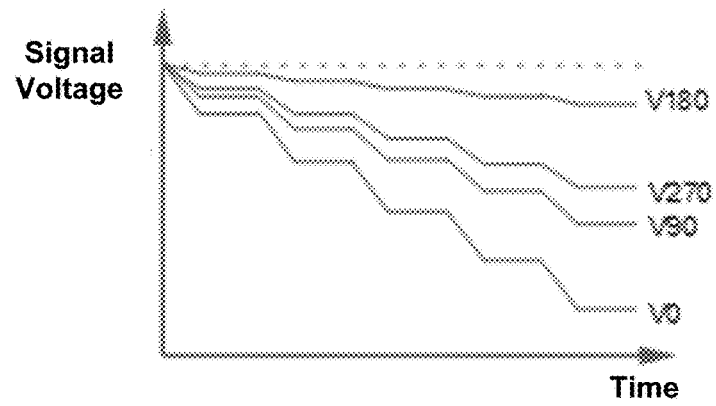
FIG. 1H is an exemplary illustration of signal voltage during charge collection

FIG. 1H is an exemplary illustration of signal voltage during charge collection. The signal voltage during charge collection illustrates the change in signal voltage of multiple phases over time. Specifically, FIG. 1H illustrates the change in signal voltage for the 0 degree phase, the 90 degree phase, the 180 degree phase, and the 270 degree phase. The decrease in signal voltage of each phase over time represents an amount of charge that is stored for a particular phase over an interval of time. As shown in FIG. 1H, the signal voltage of the 180 degree phase is much higher than the signal voltage of the 0 degree phase. Thus, the 180 degree phase includes a lower rate of charge storage than that of the 0 degree phase. In this instance, the accuracy of detection of the user's eye 120 by the eye gesture tracking device 110 can be negatively impacted due to the differences between the rates of charge storage across the different phases. As such, it may be beneficial to include a phase shift φ in the received light signals to aid in the charge collection so that a more accurate depth map of the user's eye 120 may be performed.

Figure 1I:
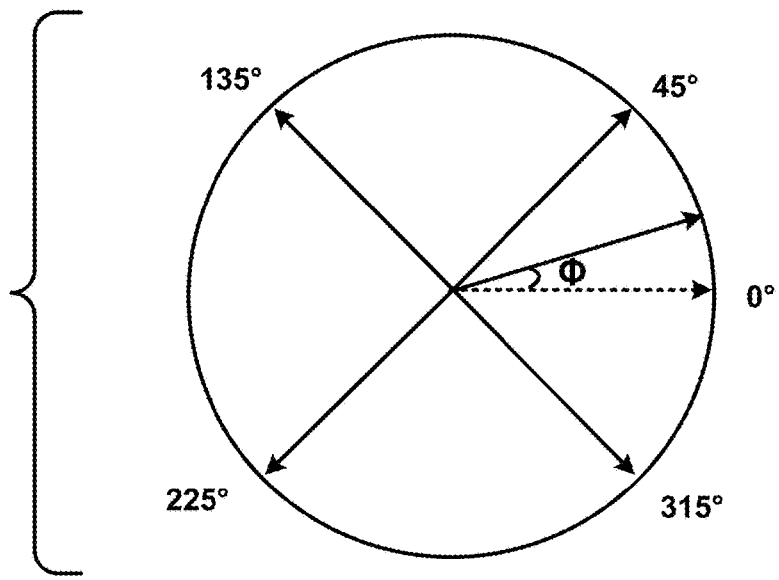
FIG. 1I is an exemplary illustration of shifted phases for charge collection.

FIG. 1I is an exemplary illustration of shifted phases for charge collection. The shifted phases for charge collection include a 45 degree phase, a 135 degree phase, a 225 degree phase, and a 315 degree phase. The phase difference Φ may be observed between light pulses emitted by the eye gesture tracking device 110 and light pulses received by the eye gesture tracking device 110. In some implementations, the phase difference Φ occurs due to a distance between the user's eye 120 and the eye gesture reading device 110. A small phase difference can make it difficult for the eye gesture tracking device 110 to efficiently detect a gesture recognition of the user's eye 120, a mapping of the user's eye 120, and the like. As such, a phase shift φ of 45 degree is illustrated in FIG. 1I to the collected charge so that all phases may be offset by the same phase shift φ of 45 degree.

Figure 1J:
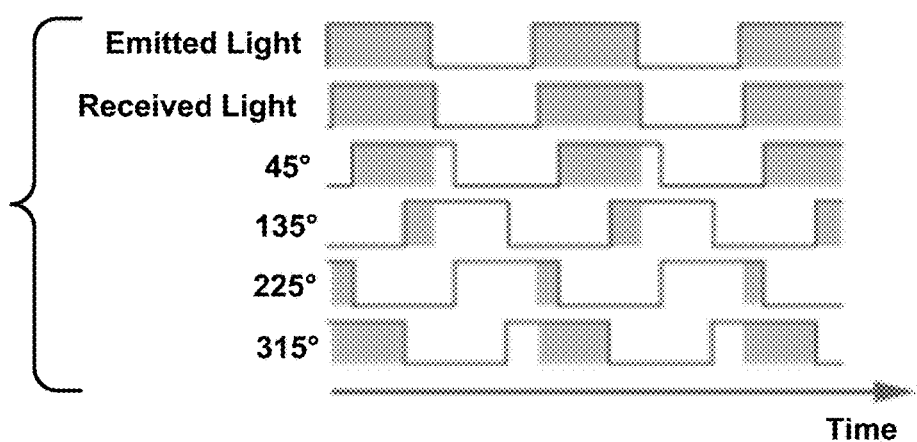
FIG. 1J is an exemplary illustration of light emission, detection and phase-shifted charge collection.

FIG. 1J is an exemplary illustration of light detection and phase-shifted charge collection. The light detection and phase-shifted charge collection includes time steps of light emission, light detection, and charge collection at the eye gesture reading device 110. At each of the time steps, data is collected to represent the received light, the charge collected at the 45 degree phase, the charge collected at the 135 degree phase, the charge collected at the 225 degree phase, and the charge collected at the 335 degree phase. The collection of charge at each phase can indicate an amount of collected charge at each of the received phases. In this instance, the amount of collected charge at each time step of each phase can impact an accuracy of the eye gesture reading device 110 in mapping the user's eye 120.

For example, the eye gesture tracking device 110 may emit light pulses modulated at a frequency $f_m$ with a duty cycle of 50%. The eye gesture tracking device 110 may receive reflected light pulses having a phase difference Φ. The TOF pixels can be controlled such that a first readout circuit of the eye gesture tracking device 110 reads the collected charge, Q45, at a shifted-phase with respect to the emitted light pulses, such as the 45 degree phase. The eye gesture tracking device 110 can also include a second readout circuit that reads the collected charge, Q225, at a shifted-phase with respect to the emitted light pulses, such as the 225 degree phase. In another time step, the TOF pixels are controlled such that first readout circuit reads the collected charge, Q135, in the phase shift of 135 degrees with respect to the emitted light pulses. In this instance, the second readout circuit can read the collected charge, Q315, in the phase shift of 315 degrees with respect to the emitted light pulses. In some implementations, the distance between the eye gesture reading device 110 and the user's eye 120 may be derived using the following two equations:

$$D = \frac{c}{8f_m}\left(\frac{3}{2} + \frac{Q225 - Q45}{|Q45 - Q225| + |Q135 - Q315|}\right), \text{ or} \quad (5)$$

$$D = \frac{c}{8f_m}\left(\frac{7}{2} + \frac{Q45 - Q225}{|Q45 - Q225| + |Q135 - Q315|}\right). \quad (6)$$

Referring again to FIG. 1J, in a condition of small phase difference Φ between light pulses emitted by the eye gesture tracking device 110 and light pulses received by the eye gesture tracking device 110, the charge collected at the 45 degree phase and at the 225 degree phase are closer over the provided time steps. In comparison to FIG. 1G, in which the charge collections are not performed with a phase shift φ and the charge collected at the 0 degree phase and at the 180 degree phase are quite different, the phase-shifted charge collection of FIG. 1J provides greater eye mapping performance due to a lower difference in charge collection at each phase in comparison. As differences in charge collection can impact the accuracy of the charge collection as a whole, phase shifts can be helpful in eye gesture detection by reducing the difference in charge collection at each phase to enable a more accurate depth map of the user's eye 120.

Figure 1K:
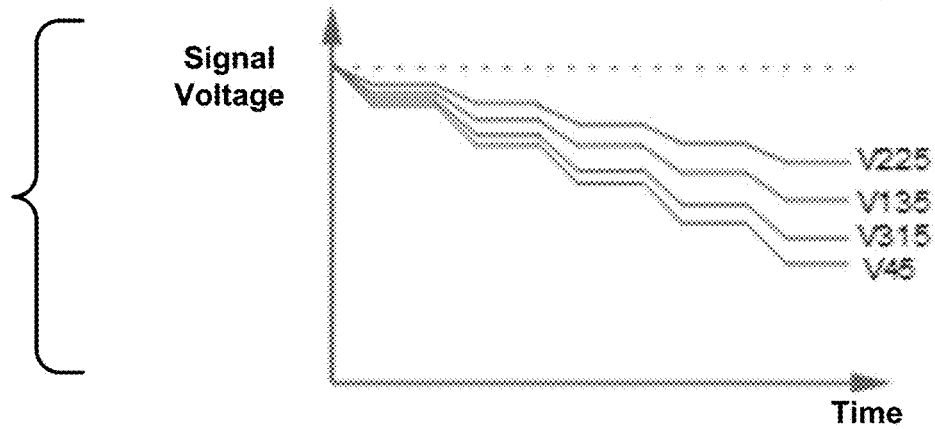
FIG. 1K is an exemplary illustration of signal voltage during phase-shifted charge collection.

FIG. 1K is an exemplary illustration of signal voltage during phase-shifted charge collection. The signal voltage during phase-shifted charge collection illustrates the change in signal voltage of multiple phases over time. Specifically, FIG. 1K illustrates the change in signal voltage for the 45 degree shifted-phase, the 135 degree shifted-phase, the 225 degree shifted-phase, and the 315 degree shifted-phase. The decrease in signal voltage of each phase over time represents an amount of charge that is stored for a particular phase over an interval of time. As shown in FIG. 1K, the signal voltage of the shifted phases includes a more similar average rate of the signal voltage drop, compared to a more different average rate of the signal voltage drop shown in FIG. 1H. The similarity in drop rates of the signal voltage of the shifted phases can enable a greater accuracy of eye gesture detection and mapping of the user's eye. As such, it may be beneficial to include a phase shift φ to the charge collection to aid in the charge collection so that a more accurate reading of the user's eye 120 may be performed.

Figure 1L:
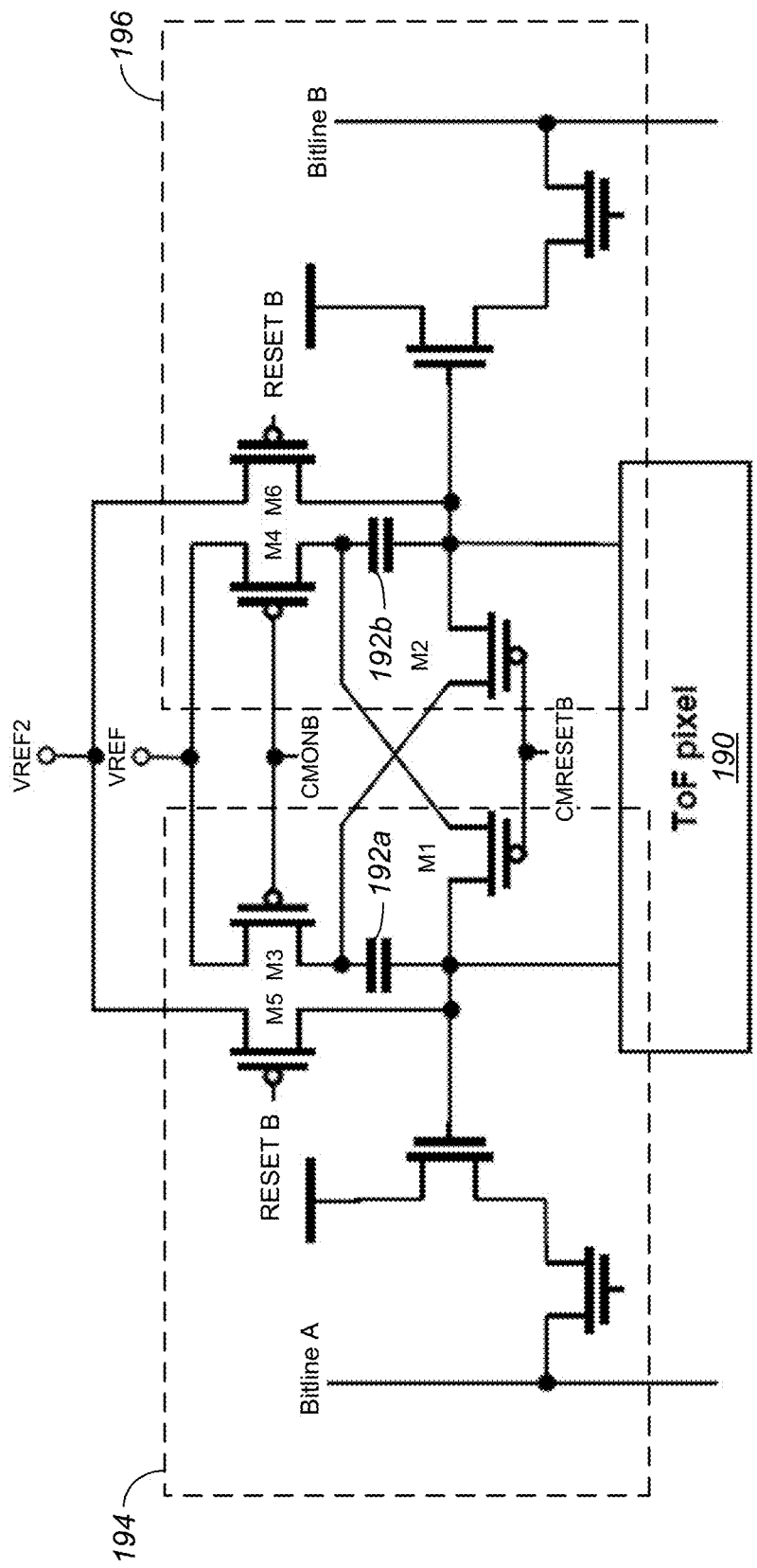
FIG. 1L is an exemplary illustration of a time-of-flight device.

FIG. 1L is an exemplary illustration of a TOF device. The TOF device includes a TOF pixel 190, two capacitors 192a and 192b, and two sets of transistors 194 and 196. Each set of the transistors can include five switch transistors (5T). In some other implementations, other arrangements of transistors may be used to achieve similar functionalities. The TOF pixel 190 can be one or more TOF pixels that are used to detect light. The charge generated by the TOF pixel 190 can be collected by the two capacitors 192a and 192b. Transistors M1-M4, which may be implemented by NMOS, PMOS, or any combination of NMOS and PMOS, are used to redistribute the collected charge by resetting the common-mode charge and connect the common-mode voltage to VREF. The voltage VREF may be the operation voltage of the TOF device 190 or a predetermined voltage depending on design constraints. Transistors M5 and M6, which may be implemented by NMOS, PMOS, or any combination of NMOS and PMOS, are used to reset the collected charge and connect them to VREF2. The voltage VREF2 may be the same voltage as VREF, the operation voltage of the TOF device 190, or a predetermined voltage depending on design constraints.

Figure 2A:
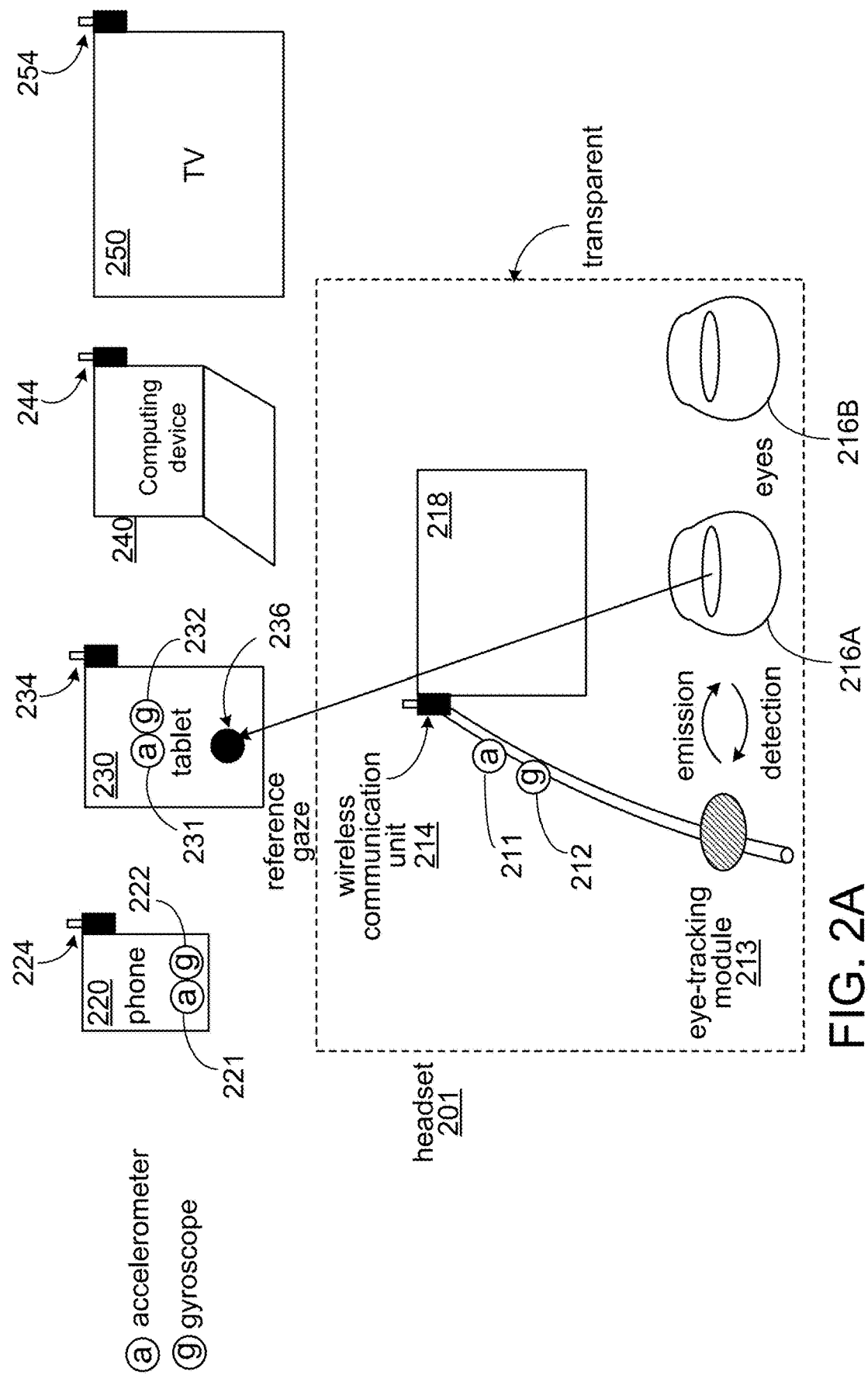
FIG. 2A is an exemplary illustration of a cross-platform peripheral control system using eye gesture tracking.

FIG. 2A is an exemplary illustration of a cross-platform peripheral control system using eye gesture tracking. The cross-platform peripheral control system using eye gesture tracking can include a wearable device such as a headset 201, and a connected device such as a phone 220, a tablet 230, a computing device 240, and/or a television 250, in communication with the headset 201. The headset 201 can be used by a pair of user's eyes 216A and/or 216B for viewing a connected device such as the phone 220, the tablet 230, the computing device 240, and/or the television 250. The headset 201 can include an eye tracking gesture device and a signal processing unit implemented in an eye-tracking module 213 for tracking gestures of one of the user's first and second eyes 216A and 216B, an accelerometer 211 and gyroscope 212 for determining a head position of the user, a wireless communication unit 214 for communicating with a connected device such as the phone 220 and/or the tablet 230 and/or the computing device 240 and/or the television 250, and a transparent lens 218. In some implementations, the transparent lens 218 may include one or more tunable elements for adjustment based on the tracking of the user's eyes 216A and/or 216B.

Here, the eye-tracking module 213 can be used to illuminate the user's eye 216A with optical signals, and detect optical signals that are reflected from the user's eye 216A. The detected optical signals can be used to determine gaze information pertaining to the user's eye 216A. The gaze information can include the user's gaze with respect to the displays of the connected device. The gaze information can also include commands corresponding to gestures of the user's eye 216A. The eye gesture commands can be provided as input commands to the connected device. In some implementations, the eye-tracking module 213 can be used to illuminate both of the user's eyes 216A and 216B with optical signals, and detect optical signals that are reflected from the user's eyes 216A and 216B to determine gaze information of both eyes 216A and 216B.

The accelerometer 211 and gyroscope 212 can be used to detect an orientation of the user's head. The orientation of the user's head can be used in effectively determining the gaze information. Further, the accelerometer 211 and the gyroscope 212 can be used to track movements of the user's head. Thus, any potential head movements of the user can be identified so that the gaze information is not misrepresented according to movements of the user's head.

The wireless communication unit 214 can be used to establish a connection between the headset 201, the phone 220, the tablet 230, the computing device 244, and/or the television 254 via a network. The network can include Wi-Fi, BLUETOOTH, BLUTETOOTH LOW ENERGY (BLE), a local area network (LAN), and the like.

The transparent lens 218 can be used to aid the user's eyes 216A and 216B in viewing the displays of the phone 220, the tablet 230, the computing device 240, and/or the television 250. The transparent lens 218 can include tunable optical elements that can be tuned based on the determined gaze information representing the tracking of the user's eyes 216A and 216B. In some implementations, the entirety of the transparent lens 218 can be tuned based on the gaze information. In other implementations, selected portions of the transparent lens 218 can be tuned based on the gaze information. For example, the selected portions of the tunable optical elements of the transparent lens 218 can be tuned to provide foveated images of particular locations at the display of the phone 220, the particular locations at the phone 220 being based on locations at the display that the gaze of the user's eyes 216A and 216B are directed to.

In some implementations, the phone 220 can include an accelerometer 221 and gyroscope 222 for determining the orientation of the phone 220, as well as a wireless communication unit 224 for communicating with the headset 201. The accelerometer 221 and the gyroscope 222 of the phone 220 can aid in tracking the location as well as the movement of the phone 220. By tracking the location and movement of the phone 220, the headset 201 can effectively determine the gaze information of the user's eyes 216A and 216B when comparing the user's focus to the location of the phone 220. The location and the movement of the phone 220 can be transmitted from the phone 220 to the headset 201 via the wireless communication device 224.

In some implementations, the tablet 230 can include an accelerometer 231 and a gyroscope 232 for determining the orientation of the tablet 230, and a wireless communication unit 234 for communicating with the headset 201. The accelerometer 231 and the gyroscope 232 of the tablet 230 can aid in tracking the location and the movement of the tablet 230. In tracking the location and movement of the tablet 230, the headset 201 can effectively determine a reference gaze point 236 of the user's eye 216A. The location and the movement of the tablet 230 can be transmitted from the tablet 230 to the headset 201 via the wireless communication unit 234.

The computing device 240 can include a wireless communication unit 244 for communicating with the headset 201. Additionally, the television 250 can include a wireless communication unit 254 for communication with the headset 201.

Figure 2B:
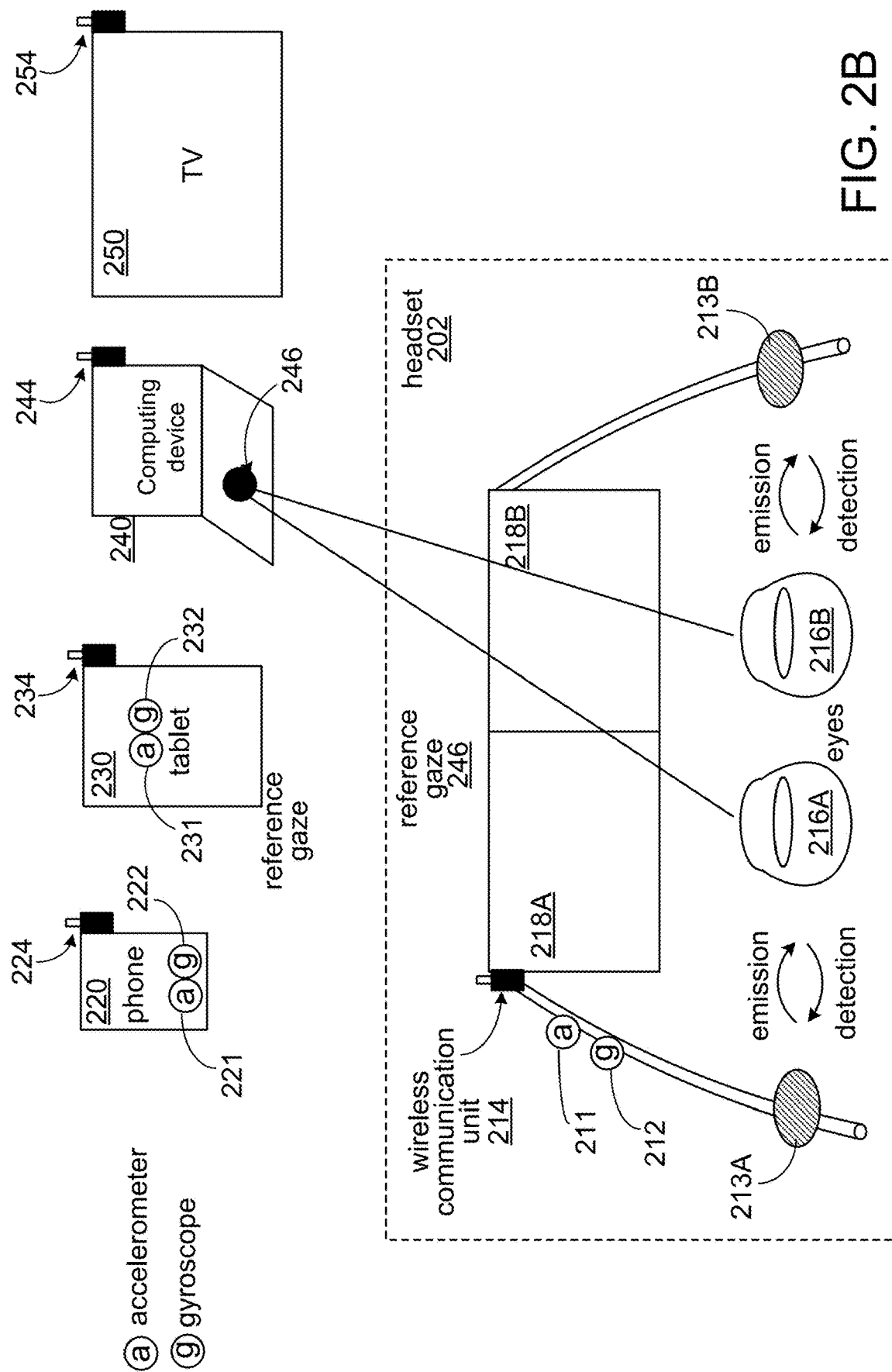
FIG. 2B is an exemplary illustration of a cross-platform peripheral control system using eye gesture tracking.

FIG. 2B is an exemplary illustration of a cross-platform peripheral control system using eye gesture tracking. The cross-platform peripheral control system can include a wearable device such as a headset 202, and a connected device such as a phone 220, a tablet 230, a computing device 240, and/or a television 250, in communication with the headset 202. The headset 202 can be used by a user's eyes 216A and 216B for viewing the connected device. The headset 202 can include two eye tracking gesture device and signal processing unit pairs, the first pair implemented in a first eye-tracking module 213A and the second pair implemented in a second eye-tracking module 213B, for tracking gestures of the user's eyes 216A and 216B, an accelerometer 211 and gyroscope 212 for determining a head position of the user, a wireless communication unit 214 for communicating with the connected device, a first transparent lens 218A including one or more tunable elements, and a second transparent lens 218B including one or more tunable elements.

The first eye-tracking module 213A can be used to illuminate the first user's eye 216A with optical signals, and detect optical signals that are reflected from the first user's eye 216A. The detected optical signals can be used to determine gaze information pertaining to the first user's eye 216A. The gaze information can include the gaze of the user's first eye with respect to the displays of connected device such as 220, 230, 240 and 250. The gaze information can also include commands corresponding to gestures of the first user's eye 216A. The eye gesture commands can be provided as input commands to the connected device.

The second eye-tracking module 213B can be used to illuminate the second user's eye 216B and detect optical signals that are reflected from the second user's eye 216B. The detected optical signals can be used to determine gaze information pertaining to the second user's eye 216B. The gaze information can include the gaze of the second user's eye 216B with respect to the displays of the connected device. The gaze information can also include commands corresponding to gestures of the second user's eye 216B. The eye gesture commands can be provided as input commands to the connected device.

The first transparent lens 218A can be used to aid the first user's eye 216A in viewing the displays of the connected device. The first transparent lens 218A can include tunable elements that can be tuned based on the determined gaze information representing the tracking of the first user's eye 216A. In some implementations, the entirety of the first transparent lens 218A can be tuned based on the gaze information. In other implementations, selected portions of the first transparent lens 218A can be tuned based on the gaze information. For example, the selected portions of tunable optical elements of the first transparent lens 218A can be tuned to foveated images of particular locations at the display of the computing device 240, the particular locations at the computing device 240 being based on locations at the display that the first user's eye 216A is focused on.

The second transparent lens 218B can be used to aid the second user's eye 216B in viewing the connected device. The second transparent lens 218B can include tunable optical elements that are tuned based on the determined gaze information representing the tracking of the second user's eye 216B. In some implementations, the entirety of the second transparent lens 218B can be tuned based on the gaze information. In other implementations, selected portions of the second transparent lens 2186 can be tuned based on the gaze information. For example, the selected portions of tunable elements of the second transparent lens 2186 can be tuned to provide enhanced focus of viewing of particular locations at the display of the computing device 240, the particular locations at the computing device 240 being based on locations that the second user's eye 216B is focused on.

In certain implementations, the first user's eye 216A and the second user's eye 216B can be focused at a single location. For example, the user's eyes 216A and 216B can include a reference gaze 246 located at the display of the computing device 240 such as a laptop or desktop. Although the reference gaze 246 may be directed towards a single point at the display of the laptop or desktop, the tunable optical elements of each of the first transparent lens 218A and the second transparent lens 2186 can be tuned independently based on the determined gaze information of the first and second user's eyes 216A and 216B.

Figure 3A:
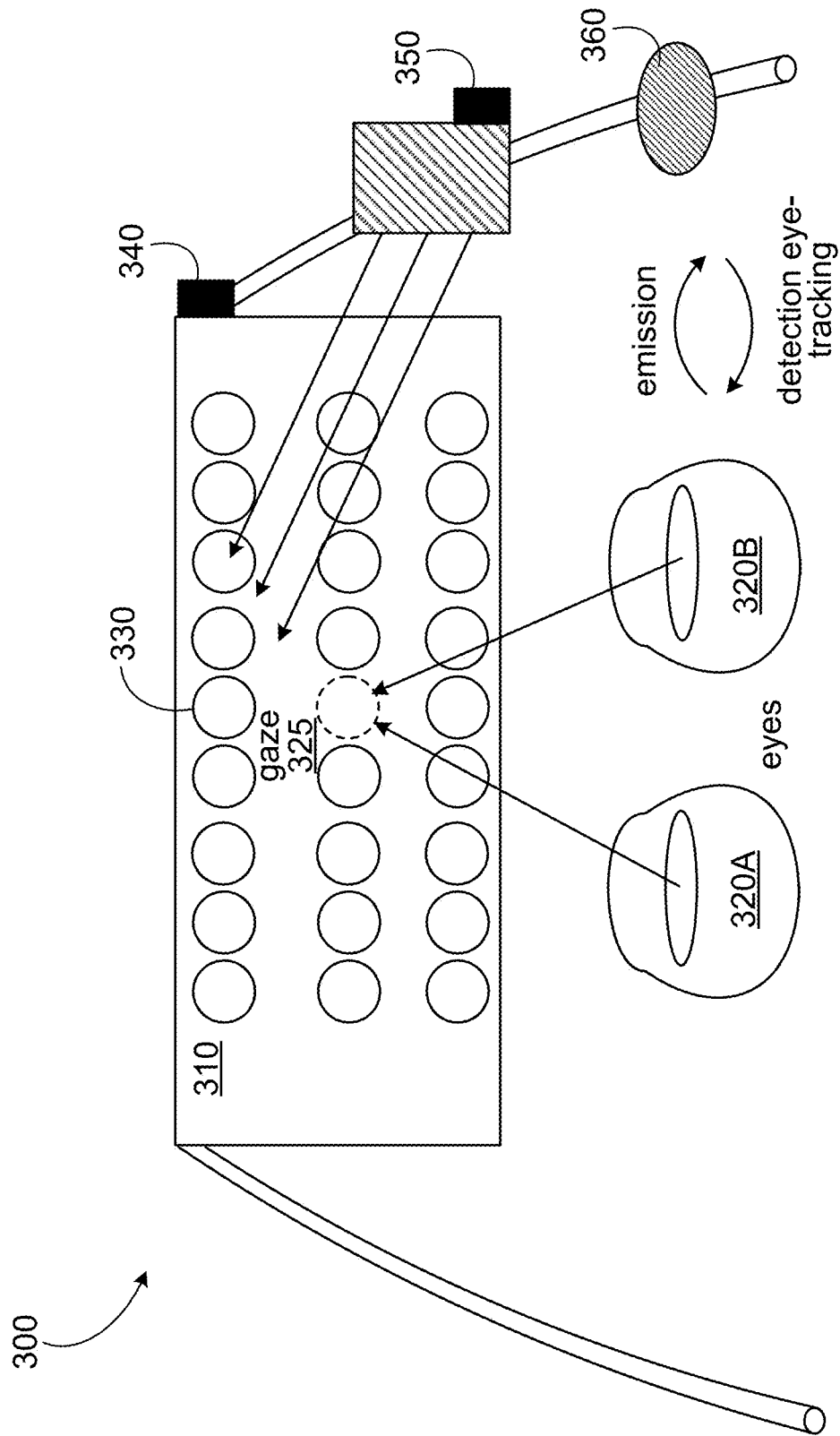
FIG. 3A is an exemplary illustration of a wearable device using eye gesture tracking.

FIG. 3A is an exemplary illustration of a wearable device 300 using eye gesture tracking. The wearable device 300 can include a mono-vision wearable device that provides light path adjustments based on eye gesture tracking. The wearable device 300 includes a transparent or an opaque screen 310 that a user can look through or look at, tunable optical elements 330 for adjusting a light path at the transparent or the opaque screen 310, a wireless communication unit 340 for communicating with remote devices, an image projector 350 for projecting 2D visuals through or at the transparent or the opaque screen 310, and an eye gesture tracking module 360 for tracking eye gestures of the user's eyes 320A and 320B and determining depth maps corresponding to each of the user's eyes 320A and 3206.

The gaze 325 of the user's eyes 320A and 320B can be determined by the eye gesture tracking module 360. In certain implementations, only certain portions of the transparent or the opaque screen 310 are tuned according to the gaze 325 of the user's eyes 320A and 320B. The gaze information corresponding to the gaze 325 can be used by the eye gesture tracking module 360 to tune a selected portion of the transparent or the opaque screen 310 such as the multiple tunable optical elements 330. The tunable optical elements 330 can be tuned to adjust the focusing/defocusing of a particular light path passing through the particular portion of the transparent or the opaque screen 310. The tunable optical elements 330 can include tunable mirrors, tunable lenses, tunable gratings or any other suitable tunable optical elements and any combination thereof. The tunable optical elements 330 can be adjusted based on the gaze information corresponding to the gaze 325 so that real time focusing/defocusing can be provided at the wearable device 300.

The real-time focusing/defocusing of the tunable optical elements 330 can be used to solve inconsistencies between accommodation and vergence when viewing displays. For example, traditional VR experiences can cause feelings of nausea due to inconsistent depth perception mechanisms. One inconsistent depth perception mechanism arises when the focus of a user's eyes (accommodation) feels that images are at the same distance of a display, while the images are simultaneously felt at different depths by the convergence of the user's eyes (vergence). These conflicting feelings that are perceived by the user can cause feelings of sickness due to the inconsistency between accommodation and vergence.

To solve this inconsistent depth perception mechanism, among other inconsistencies, the present method of eye tracking can be implemented in a wearable device such as the wearable device 300. The wearable device 300 can refocus light based on eye gaze information to adjust the angle of eye-incident light passing through or at selected portions of the transparent or the opaque screen 310. Thus, the tunable optical elements 330 of the transparent or the opaque screen 310 can be configured to refocus light based on the determined gaze information of the user's eyes 320A and 320B, thereby providing a solution to the inconsistencies that can arise between accommodation and vergence during certain viewing experiences.

Figure 3B:
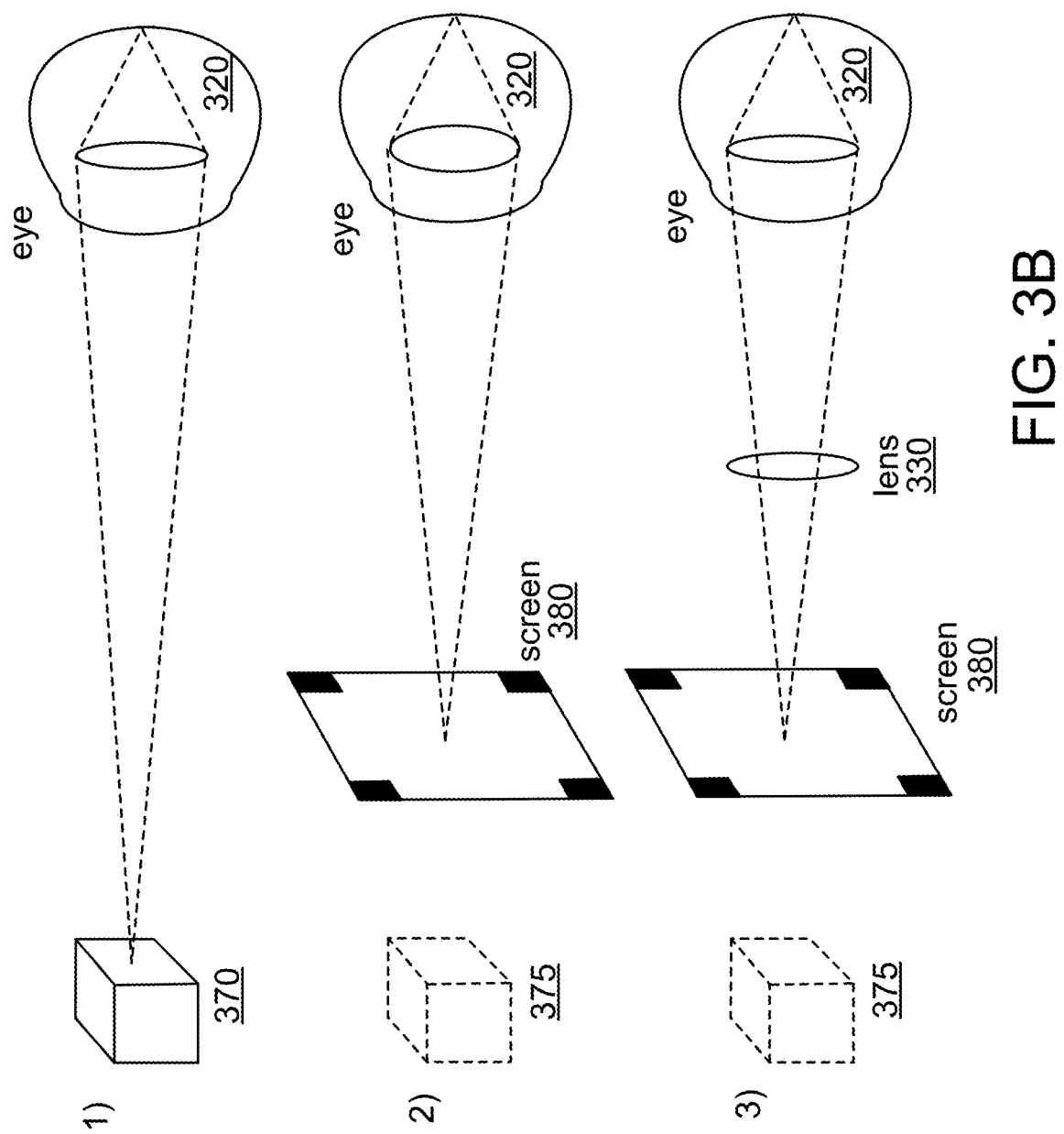
FIG. 3B is an exemplary illustration of an optical image-refocusing system using a lens.

FIG. 3B is an exemplary illustration of an optical image-refocusing system using a lens. The optical image-refocusing system using a lens illustrates the use of a lens to refocus an object illusion according to gaze information of a user's eye.

At instance 1 of the optical image-refocusing system using a lens, the user's eye 320 is viewing the object 370 through a medium such as air without using a screen such as a VR display. The user's eye 320 may not be viewing the object 370 through a transparent lens. Further, the user's eye 320 is viewing the real object 370, rather than a virtual representation of the object.

At instance 2 of the optical image-refocusing system using a lens, the user's eye 320 is viewing the object illusion 375 through the screen 380. In this instance, an image projector may be projecting a virtual representation of the object 370 as the object illusion 375 through the screen 380. In this instance, the user's eye 320 may be experiencing an inconsistency between accommodation and vergence.

At instance 3 of the optical image-refocusing system using a lens, the user's eye 320 is viewing the object illusion 375 through a lens 330 situated between the user's eye 320 and the screen 380. The lens 330 can be a fixed lens that is used to refocus the object illusion 375. In other implementations, the lens 330 can be a tunable lens that is used to dynamically refocus the object illusion 375 through the screen 380 in real time. In this instance, the lens 330 can be tuned based on determined gaze information of the user's eye 320.

Figure 3C:
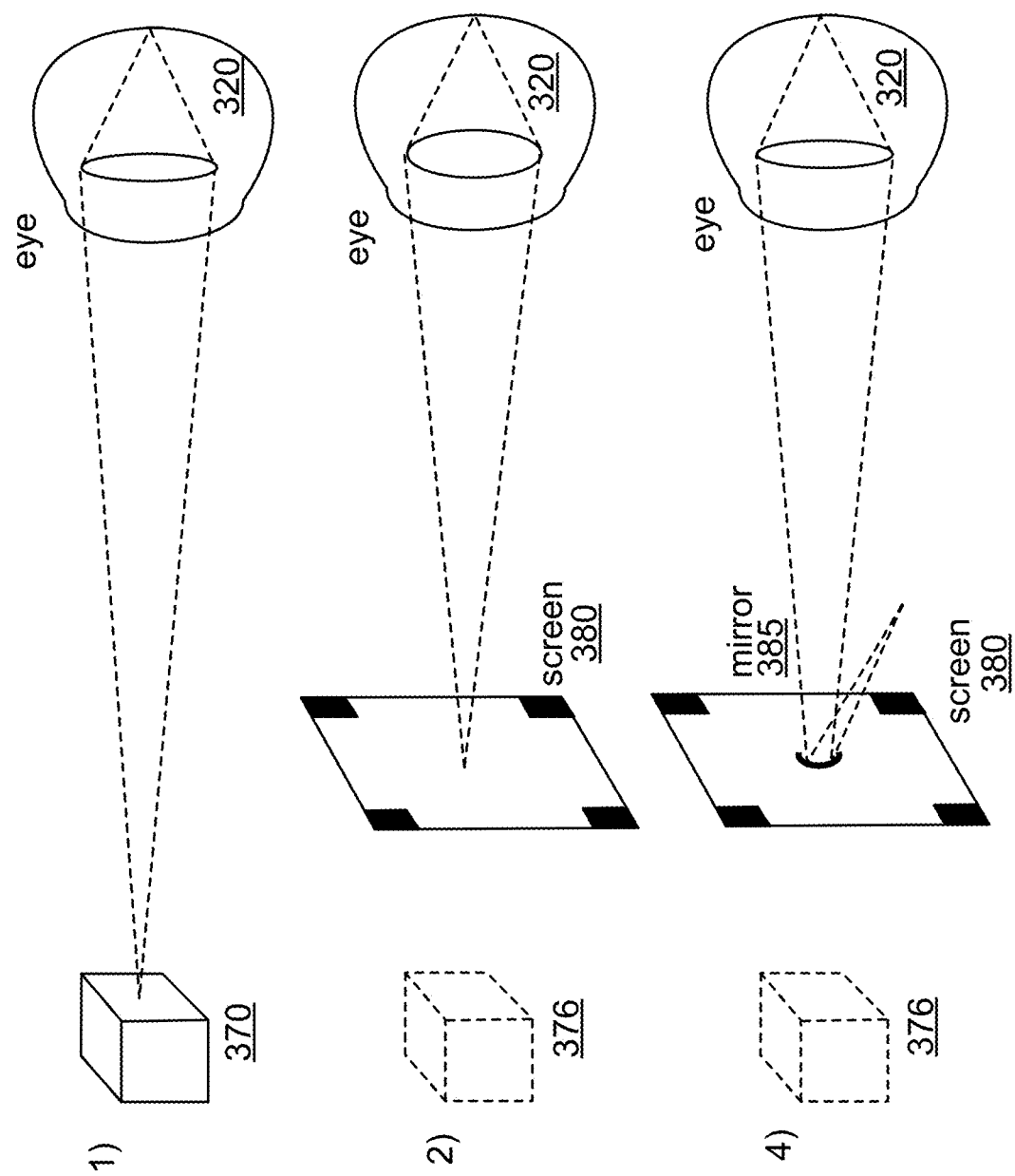
FIG. 3C is an exemplary illustration of an optical image-refocusing system using a mirror.

FIG. 3C is an exemplary illustration of an optical image-refocusing system using a mirror. The optical image-refocusing system using a mirror illustrates the use of a mirror to refocus an object illusion according to gaze information of a user's eye.

At instance 1 of the optical image-refocusing system using a mirror, the user's eye 320 is viewing the object 370 through a medium such as air without using a screen such as a VR display. The user's eye 320 may not be viewing the object 370 through a transparent lens. Further, the user's eye 320 is viewing the real object 370, rather than a virtual representation of the object.

At instance 2 of the optical image-refocusing system using a mirror, the user's eye 320 is viewing the object illusion 376 through the screen 380. In this instance, an image projector may be projecting a virtual representation of the object 370 as the object illusion 376 through the screen 380. In this instance, the user's eye 320 may be experiencing an inconsistency between accommodation and vergence.

At instance 4 of the optical image-refocusing system using a mirror, the user's eye 320 is viewing the object illusion 376 through a screen 380 that includes a mirror 385. The mirror 385 can be a fixed mirror that is used to refocus the object illusion 376. In other implementations, the mirror 385 can be a tunable mirror that is used to dynamically refocus the object illusion 376 through the screen 380 that includes the mirror 385 in real time. In this instance, the mirror 385 can be tuned based on determined gaze information of the user's eye 320.

Figure 4:
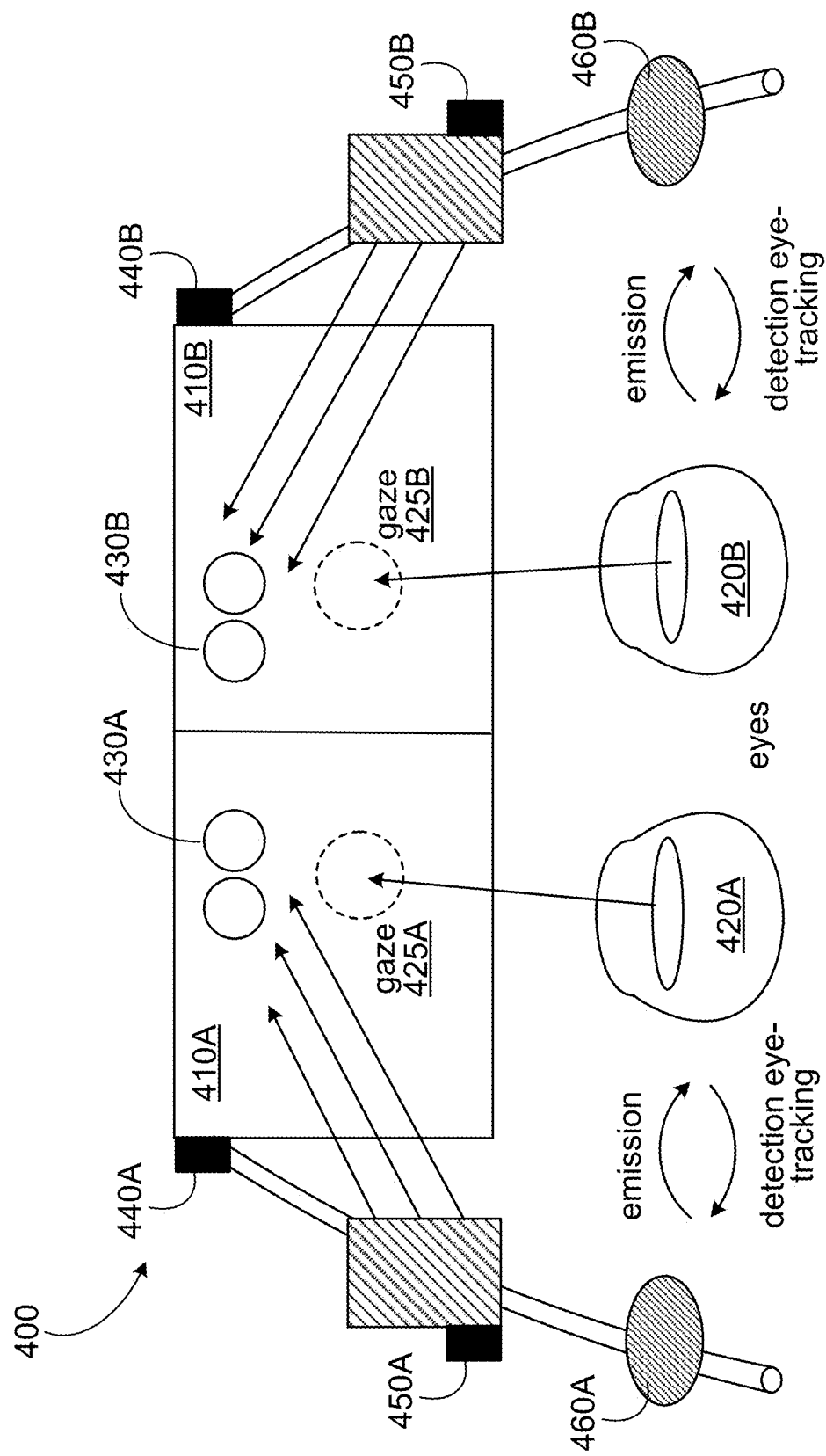
FIG. 4 is an exemplary illustration of a wearable device using eye gesture tracking.

FIG. 4 is an exemplary illustration of a wearable device 400 using eye gesture tracking. The wearable device 400 using eye gesture tracking can include a stereo-vision wearable device that provides light path adjustments based on eye gesture tracking. The wearable device 400 includes a first transparent or opaque screen 410A and a second transparent or opaque screen 4106 that the user can look through or look at, a first set of tunable optical elements 430A located for adjusting a light path at the first transparent or opaque screen 410A and a second set of tunable optical elements 430B for adjusting a light path at the second transparent or opaque screen 4106. The wearable device 400 may further include a first wireless communication unit 440A for communicating with remote devices or a second wireless communication unit 440B for communication with the remote devices, a first image projector 450A for projecting 2D visuals through or at the first transparent or opaque screen 410A, a second image projector 450B for projecting 2D visuals through or at the second transparent or opaque screen 4106, a first eye gesture tracking module 460A for tracking eye gestures of the first user's eye 420A and determining a depth map corresponding to the first user's eye 420A, and a second eye gesture tracking module 460B for tracking eye gestures of the second user's eye 420B and determining a depth map corresponding to the second user's eye 420B.

The wearable device 400 may further include one continuous or two separate transparent or opaque screens 410A and 4106 which enable two distinct gaze points 425A and 425B to be determined. As each of the user's eyes 420A and 420B is tracked separately by each respective eye gesture tracking module 460A and 460B, the first and second optical elements 430A and 430B can be tuned independent from one another. Further, each of the image projectors 450A and 450B can operate independently. As such, a portion can be selected at each of the transparent or opaque screens 410A and 4106 to refocus light incident on each of the user's eyes 420A and 420B. In this instance, 3D projections can be interpreted by the user's eyes 420A and 420B via the simultaneous projection of multiple images through or at both of the transparent or opaque screens 410A and 4106.

Figure 5B:
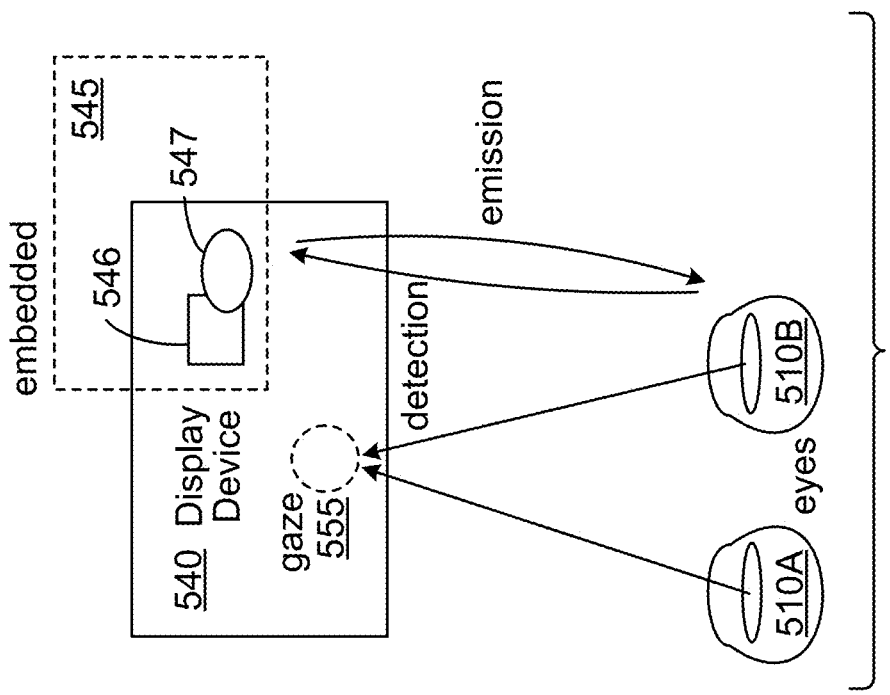
FIG. 5B is an exemplary illustration of an embedded eye gesture tracking device enclosed in a machine.
Figure 5A:
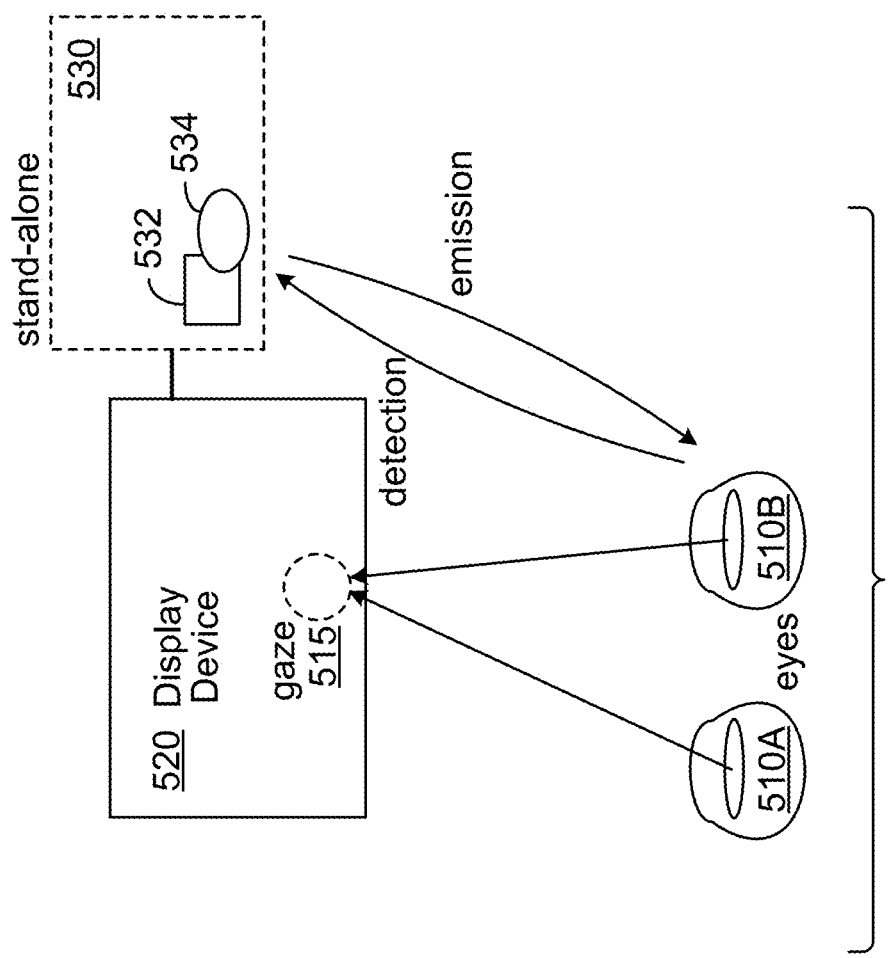
FIG. 5A is an exemplary illustration of a stand-alone eye gesture tracking device attached to a machine.

FIG. 5A is an exemplary illustration of a stand-alone eye gesture tracking device attached to a machine. The stand-alone eye gesture tracking device is implemented as a stand-alone peripheral device 530 located in proximity of a machine such as a display device 520. The stand-alone eye gesture tracking device attached to a machine includes a display device 520 in communication with a stand-alone peripheral device 530 that is located at a remote location away from a user's eyes 510A and 510B.

The stand-alone peripheral device 530 includes a mechanical module 532 to control the direction of light emission and detection from an eye gesture tracking module 534, so that the user's eyes are always located by the stand-alone peripheral device 530. The eye gesture tracking module 534 tracks the eye gestures of the user's eyes 510A and 510B and determines gaze information corresponding to the user's eyes 510A and 510B. The display device 520 can include a gaze reference point 515 corresponding to a focus of the user's eyes 510A and 510B with respect to the display device 520. The gaze reference point 515 can be determined by the eye gesture tracking module 534 of the stand-alone peripheral device 530. In certain implementations, the display device 520 can include tunable optical elements that are tuned based on the gaze reference point 515. The tunable optical elements can include tunable mirrors located at the display device 520. In other implementations, the display device 520 can include fixed optical elements such as fixed mirrors for light path refocusing.

The eye gesture tracking module 530 can be configured to provide output data to the display device 520. The output data can include gaze information of the user's eyes 510A and 510B. The gaze information can be used by the display device 520 to render an image at a particular portion of the display corresponding to the gaze reference point 515 of the user. The rendered image can be shown at the display of the display device 520 by an array of light-emitting diodes generating visible light, liquid crystals filtering white light, or any other array of light sources located at the display of the display device 520. Further, the rendered image can be shown at the display of the display device 520 by optical refraction, diffraction, reflection, guiding, or any other optical techniques.

FIG. 5B is an exemplary illustration of an eye gesture tracking device embedded in a machine. The eye gesture tracking device embedded in a machine includes an embedded peripheral device 545 integrated into a machine such as a display device 540. The embedded peripheral device 545 can include a mechanical module 546 to control the direction of light emission and detection from an eye gesture tracking module 547, so that the user's eyes are always located by the embedded peripheral device 545. The eye gesture tracking module 547 tracks the eye gestures of the user's eyes 510A and 510B and determines gaze information corresponding to the user's eyes 510A and 510B.

The display device 540 can further include a gaze reference point 555 representing the location at the display device 540 in which the user's eyes 510A and 510B are focused at. In certain implementations, the display device 540 can include tunable optical elements that are tuned based on the gaze reference point 555. The tunable optical elements can include tunable mirrors located at the display device 540. In other implementations, the display device 540 can include fixed optical elements such as fixed mirrors.

In some implementations, the distance between the eye 510A or 510B and the eye tracking module 534 and 547 can be determined based on TOF concept or by other methods such as imaging processing or tri-angulation. The optical emission power can be adjusted accordingly based on the distance between the eye 510A or 510B and the eye tracking module 534 and 547. For example, the optical emission power can be dynamically lowered to reduce the exposure of the eye 510A or 510B to the optical emission given a close distance between the eye 510A or 510B and the eye tracking module 534 and 547.

Figure 6:
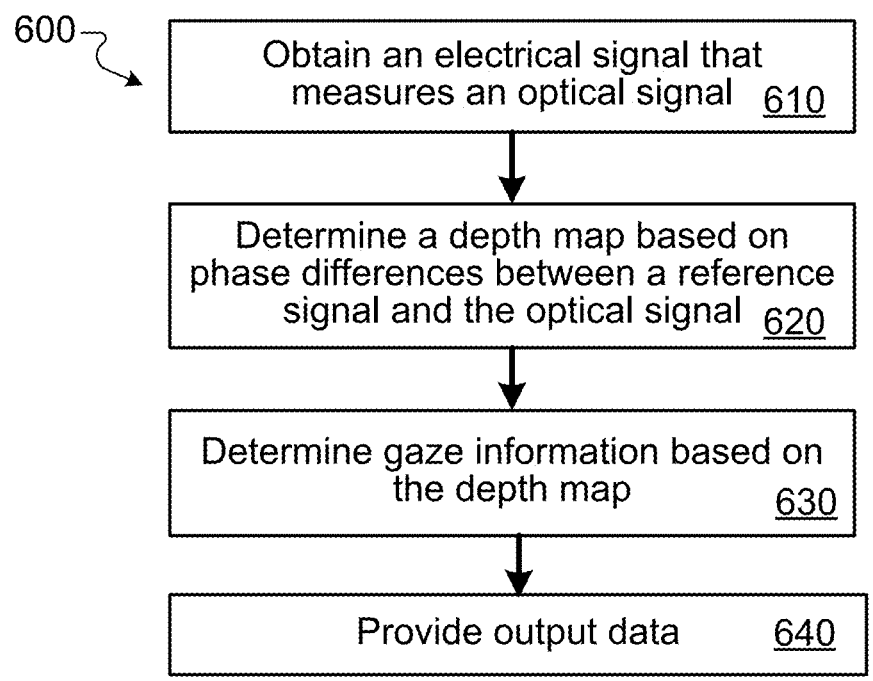
FIG. 6 is a flow chart illustrating a process for eye gesture tracking.

FIG. 6 is a flow chart illustrating a process 600 for eye gesture tracking, according to certain exemplary implementations. The process 600 for eye gesture tracking describes a process of monitoring the movement of an eye based on a generated depth map of the eye. At step 610, an electrical signal is obtained that represents a measurement of an optical signal reflected from an eye. The optical signal can be provided by an optical source. The optical source can be biased by a modulated voltage signal that is in sync with a predetermined reference signal. As such, the optical source can provide an optical signal in the direction of the eye, to be reflected back from the eye.

The reflected optical signal can be received by one or more photodetectors. In some implementations, the received optical signal can be filtered to remove certain wavelengths. For example, one or more filters can be provided to filter the optical signal so that only target wavelengths remain in the filtered optical signal. In certain implementations, one or more lenses can be provided to focus the optical signal before it is received by the photodetector. The lenses can be transparent lenses, fixed lenses, tunable lenses, lenses based on photonic gratings, and the like.

At step 620, a depth map is determined based on phase differences between the received optical signal and the reference signal. The received optical signal can be compared to the reference signal as it is received. In other implementations, the received optical signal can be filtered and then a comparison can be provided between the filtered optical signal and the reference signal. The depth map can include one or more data sets of 3D information corresponding to the eye. In some implementations, a 3D representation of the eye can be generated according to the 3D information of the depth map. The depth map can be determined persistently in real time. The depth map can also be determined and updated at predetermined points in time. For example, the depth map can be determined and updated every microsecond, millisecond, every second, or the like.

At step 630, gaze information is determined based on the depth map. The gaze information can represent a gaze of the eye based on the depth map. In some implementations, the gaze information can be determined based on the provided comparison between the reference signal and the reflected optical signal. Further, the gaze information can include one or more of an identification of a particular region of the eye, an identification of a pupil of the eye, an identification of an iris of the eye, or an identification of a physiological structure of the eye. In certain implementations, eye gestures of the eye can be determined from the gaze information. The eye gesture information can include one or more of a movement of the eye, a rotation of the eye, a steady state of the eye, a duration of the steady state of the eye, a closed state of the eye, a duration of the closed state of the eye, an open state of the eye, a duration of the open state of the eye, a blinking state of the eye, a duration of the blinking state of the eye, or a frequency of the blinking state of the eye.

The depth map can be used to generate an iris vector normal to a plane that is tangential to the eye. In this instance, the gaze information can be determined based on the iris vector and the depth map. The depth map can also be used to generate a pupil position of the eye on a plane that is tangential to the eye. In this instance, the gaze information can be determined based on the pupil position of the eye and the depth map.

At step 640, the gaze information of the eye is provided as output data. The output data representing the gaze information can be transmitted to a device, a machine, a system, and the like. In this instance, the gaze information can be transmitted as input data to the device, machine, or system. Additionally, eye gestures determined from the gaze information can be provided as output data. The eye gestures can be used to provide commands to or interact with devices, machines, or systems. For example, if the eye is tracked to have blinked three times in quick succession, this may indicate a command to be provided to a remote device such as a television. As such, the television may be configured to turn off if the eye is tracked to blink several times in rapid succession.

Figure 7:
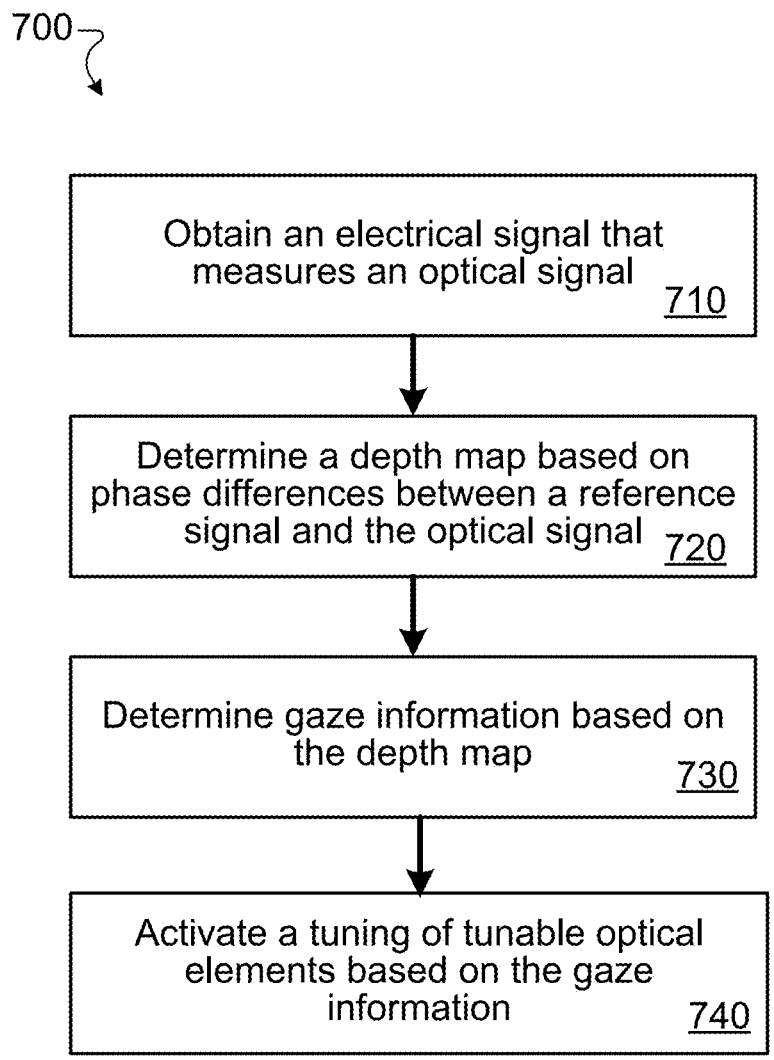
FIG. 7 is a flow chart illustrating a process for tuning optical elements based on eye gesture tracking.

FIG. 7 is a flow chart illustrating a process 700 for tuning optical elements based on eye gesture tracking, according to certain exemplary implementations. The process 700 for tuning optical elements based on eye gesture tracking describes a process of monitoring the movement of an eye and tuning optical elements based on the eye movement. At step 710, an electrical signal is obtained that represents a measurement of an optical signal reflected from an eye. The optical signal can be provided by an optical source. The optical source can be biased by a modulated voltage signal that is in sync with a predetermined reference signal. As such, the optical source can provide an optical signal in the direction of the eye, to be reflected back from the eye.

The reflected optical signal can be received by one or more photodetectors. In some implementations, the received optical signal can be filtered to remove certain wavelengths. For example, one or more filters can be provided to filter the optical signal so that only target wavelengths remain in the filtered optical signal. In certain implementations, one or more lenses can be provided to focus the optical signal before it is received by the photodetector. The lenses can be transparent lenses, fixed lenses, tunable lenses, lenses based on photonic grating, and the like.

At step 720, a depth map is determined based on phase differences between the received optical signal and the reference signal. The received optical signal can be compared to the reference signal as it is received. In other implementations, the received optical signal can be filtered and then a comparison can be provided between the filtered optical signal and the reference signal. The depth map can include one or more data sets of 3D information corresponding to the eye. In some implementations, a 3D representation of the eye can be generated according to the 3D information of the depth map. The depth map can be determined persistently in real time. The depth map can also be determined and updated at predetermined points in time. For example, the depth map can be determined and updated every microsecond, millisecond, every second, or the like.

At step 730, gaze information is determined based on the depth map. The gaze information can represent a gaze of the eye based on the depth map. The gaze information can include one or more of an identification of a particular region of the eye, an identification of a pupil of the eye, an identification of an iris of the eye, or an identification of a physiological structure of the eye. In certain implementations, eye gestures of the eye can be determined from the gaze information. The eye gesture information can include one or more of a movement of the eye, a rotation of the eye, a steady state of the eye, a duration of the steady state of the eye, a closed state of the eye, a duration of the closed state of the eye, an open state of the eye, a duration of the open state of the eye, a blinking state of the eye, a duration of the blinking state of the eye, or a frequency of the blinking state of the eye.

The depth map can further be used to generate an iris vector normal to a plane that is tangential to the eye. In this instance, the gaze information can be determined based on the iris vector and the depth map. The depth map can also be used to generate a pupil position of the eye on a plane that is tangential to the eye. In this instance, the gaze information can be determined based on the pupil position of the eye and the depth map.

At step 740, tuning of tunable optical elements is activated based on the determined gaze information. The gaze information can be used to tune particular tunable optical elements. For example, the gaze information can include a focus of the eye with respect to a particular display. The focus of the eye can be directed through a tunable optical element such as a tunable lens or mirror. Based on the gaze information, the tunable lens or mirror can be activated, or tuned, to refocus light pathing through the lens or mirror. In some implementations, the tunable optical elements can be located at a display. In this instance, the tunable optical elements can be activated or tuned at the display in real time as the eye is tracked. The tunable optical elements can include one or more lenses, mirrors, or any combination thereof.

As such, the tunable optical elements can be adjusted based on the movement, or lack thereof, of the tracked eye. The tunable optical elements can be used to provide dynamic focusing and defocusing in real time. For example, the tunable optical elements can be used to solve inconsistencies between accommodation and vergence when viewing images at a VR or AR display.

Figure 8:
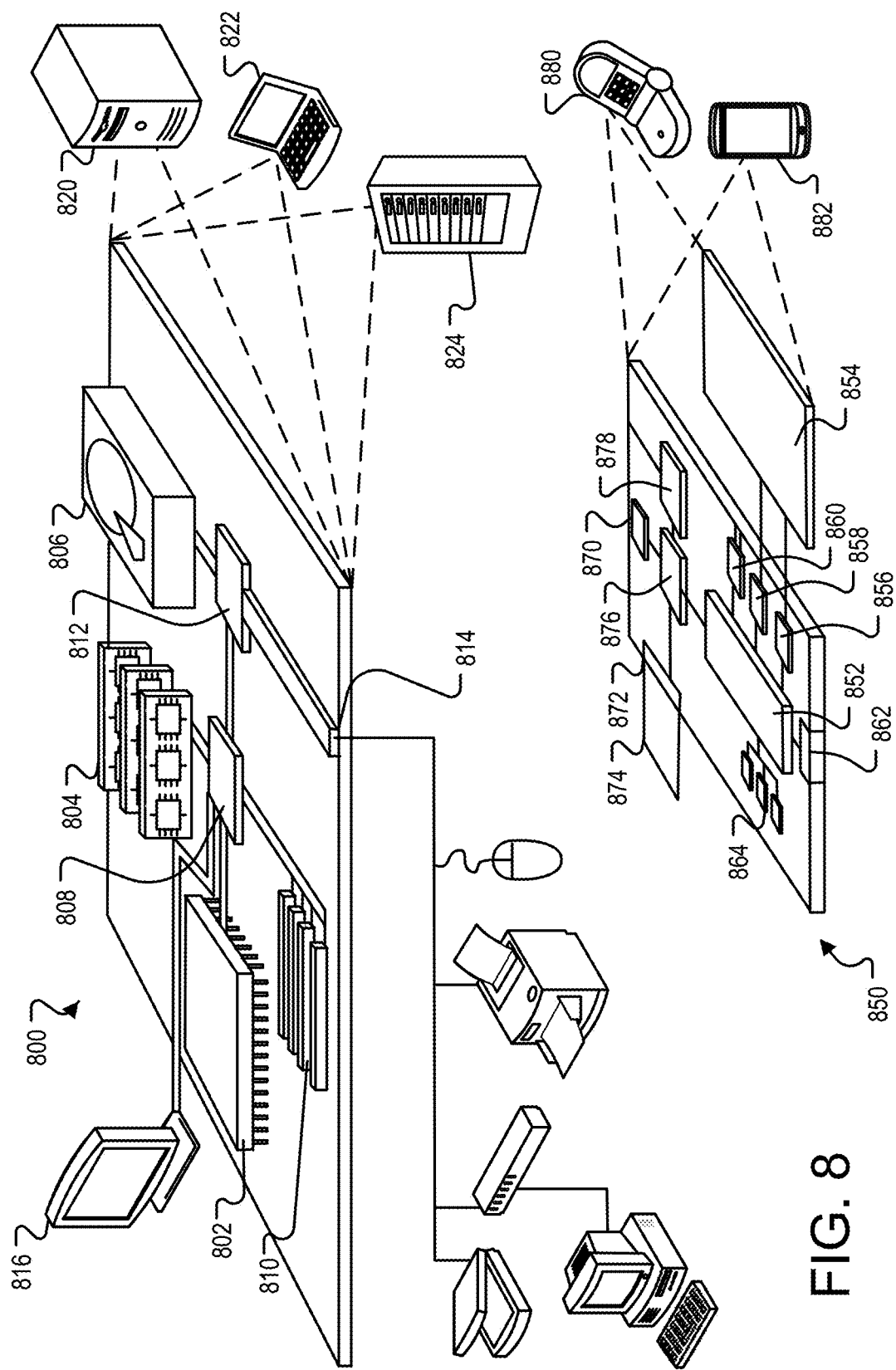
FIG. 8 is an exemplary illustration of a computer device and a mobile computer device.

FIG. 8 shows an example of a generic computer device 800 and a generic mobile computer device 850, which may be used with the techniques described here. Computing device 800 is intended to represent various forms of digital computers, such as laptops, desktops, workstations, personal digital assistants, servers, blade servers, mainframes, and other appropriate computers. Computing device 850 is intended to represent various forms of mobile devices, such as personal digital assistants, cellular telephones, smartphones, and other similar computing devices. The components shown here, their connections and relationships, and their functions, are meant to be exemplary only, and are not meant to limit implementations of the inventions described and/or claimed in this document.

Computing device 800 includes a processor 802, memory 804, a storage device 806, a high-speed interface 808 connecting to memory 804 and high-speed expansion ports 810, and a low speed interface 812 connecting to low speed bus 814 and storage device 806. Each of the components 802, 804, 806, 808, 810, and 812, are interconnected using various busses, and may be mounted on a common motherboard or in other manners as appropriate. The processor 802 may process instructions for execution within the computing device 800, including instructions stored in the memory 804 or on the storage device 806 to display graphical information for a GUI on an external input/output device, such as display 816 coupled to high speed interface 808. In other implementations, multiple processors and/or multiple buses may be used, as appropriate, along with multiple memories and types of memory. Also, multiple computing devices 800 may be connected, with each device providing portions of the necessary operations (e.g., as a server bank, a group of blade servers, or a multi-processor system).

The memory 804 stores information within the computing device 800. In one implementation, the memory 804 is a volatile memory unit or units. In another implementation, the memory 804 is a non-volatile memory unit or units. The memory 804 may also be another form of computer-readable medium, such as a magnetic or optical disk.

The storage device 806 is capable of providing mass storage for the computing device 800. In one implementation, the storage device 806 may be or contain a computer-readable medium, such as a floppy disk device, a hard disk device, an optical disk device, or a tape device, a flash memory or other similar solid state memory device, or an array of devices, including devices in a storage area network or other configurations. A computer program product may be tangibly embodied in an information carrier. The computer program product may also contain instructions that, when executed, perform one or more methods, such as those described above. The information carrier is a computer- or machine-readable medium, such as the memory 804, the storage device 806, or a memory on processor 802.

The high speed controller 808 manages bandwidth-intensive operations for the computing device 800, while the low speed controller 812 manages lower bandwidth-intensive operations. Such allocation of functions is exemplary only. In one implementation, the high-speed controller 808 is coupled to memory 804, display 816 (e.g., through a graphics processor or accelerator), and to high-speed expansion ports 810, which may accept various expansion cards (not shown). In the implementation, low-speed controller 812 is coupled to storage device 806 and low-speed expansion port 814. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. It may also be implemented as part of a rack server system 824. In addition, it may be implemented in a personal computer such as a laptop computer 822. Alternatively, components from computing device 800 may be combined with other components in a mobile device (not shown), such as device 850. Each of such devices may contain one or more of computing device 800, 850, and an entire system may be made up of multiple computing devices 800, 850 communicating with each other.

Computing device 850 includes a processor 852, memory 864, an input/output device such as a display 854, a communication interface 866, and a transceiver 868, among other components. The device 850 may also be provided with a storage device, such as a microdrive or other device, to provide additional storage. Each of the components 850, 852, 864, 854, 866, and 868, are interconnected using various buses, and several of the components may be mounted on a common motherboard or in other manners as appropriate.

The processor 852 may execute instructions within the computing device 840, including instructions stored in the memory 864. The processor may be implemented as a chipset of chips that include separate and multiple analog and digital processors. The processor may provide, for example, for coordination of the other components of the device 850, such as control of user interfaces, applications run by device 850, and wireless communication by device 850.

Processor 852 may communicate with a user through control interface 848 and display interface 856 coupled to a display 854. The display 854 may be, for example, a TFT LCD (Thin-Film-Transistor Liquid Crystal Display) or an OLED (Organic Light Emitting Diode) display, or other appropriate display technology. The display interface 856 may comprise appropriate circuitry for driving the display 854 to present graphical and other information to a user. The control interface 858 may receive commands from a user and convert them for submission to the processor 852. In addition, an external interface 862 may be provide in communication with processor 852, so as to enable near area communication of device 850 with other devices. External interface 862 may provide, for example, for wired communication in some implementations, or for wireless communication in other implementations, and multiple interfaces may also be used.

The memory 864 stores information within the computing device 850. The memory 864 may be implemented as one or more of a computer-readable medium or media, a volatile memory unit or units, or a non-volatile memory unit or units. Expansion memory 854 may also be provided and connected to device 850 through expansion interface 852, which may include, for example, a SIMM (Single In Line Memory Module) card interface. Such expansion memory 854 may provide extra storage space for device 850, or may also store applications or other information for device 850. Specifically, expansion memory 854 may include instructions to carry out or supplement the processes described above, and may include secure information also. Thus, for example, expansion memory 854 may be provide as a security module for device 850, and may be programmed with instructions that permit secure use of device 850. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 864, expansion memory 854, memory on processor 852, or a propagated signal that may be received, for example, over transceiver 868 or external interface 862.

Device 850 may communicate wirelessly through communication interface 866, which may include digital signal processing circuitry where necessary. Communication interface 866 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 868. In addition, short-range communication may occur, such as using a Bluetooth, WiFi, or other such transceiver (not shown). In addition, GPS (Global Positioning System) receiver module 850 may provide additional navigation- and location-related wireless data to device 850, which may be used as appropriate by applications running on device 850.

Device 850 may also communicate audibly using audio codec 860, which may receive spoken information from a user and convert it to usable digital information. Audio codec 860 may likewise generate audible sound for a user, such as through a speaker, e.g., in a handset of device 850. Such sound may include sound from voice telephone calls, may include recorded sound (e.g., voice messages, music files, etc.) and may also include sound generated by applications operating on device 850.

The computing device 850 may be implemented in a number of different forms, as shown in the figure. For example, it may be implemented as a cellular telephone 880. It may also be implemented as part of a smartphone 882, personal digital assistant, or other similar mobile device.

A number of applications can be implemented based on the concept described herein. For example, the TOF pixel as shown in FIGS. 1B and 1C can also be used to detect the user's facial characteristic, with the option to include eye gesture tracking, for facial recognition or emotion detection. As another example, the eye gesture tracking based on the implementations described herein can be used to replace or supplement mouse to locate where the user's interest or focus at the display. In some implementations, the eye gesture tracking based on the implementations described herein can be used for more accurate advertisement targeting or to predict user behavior. For example, machine learning with artificial neuro-network can be used to learn and recognize the user behavior based on the where the user looks at the display. Different weightings can be given for different contents based on different user behaviors, such as (1) not looking (2) looking but do not choose (3) look and choose, where the weighting could be from small to large. Furthermore, the duration of the user's focus on a particular content can also be used to record the user's interest level, for example, the longer the duration, the higher the weighting. In some implementations, displaying advertisement on a website can result in different charge to the payer of the advertisement based on the interest level received from the users, rather than the conventional click or no-click behaviors.

In some implementations, the eye gesture tracking based on the implementations described herein can also be used for gaming. For example, referring to FIG. 2A, a car racing or aircraft flying game may be played by a user on the mobile phone 224, or the tablet 230. Changes of user's eye gaze over time may be used to control a movement (e.g., direction) of a car indicating where the user wants to go. As another example, data collected by the accelerometer 211, the gyroscope 212, and the eye-tracking module may be used to track movements of both the user's head movement and eye gaze. In some implementations, a separate button may be included to control the speed and another optional button may further be included to control an extra action such as shooting or switching gear. The information of the head movement and the information of the eye gaze, alone or combined, may be used by a game running on the mobile phone or the tablet to determine an action of a user, and the game may then respond accordingly. In this example, a combination of a vector representing a turning position of the user's head and a vector representing a gaze of the user's eye may be used to determine the angle of the gaze with respect to the head, which may be used by the game to interpret an action or a state of mind of the user.

A number of implementations have been described. Nevertheless, it will be understood that various modifications may be made without departing from the spirit and scope of the disclosure. For example, various forms of the flows shown above may be used, with steps re-ordered, added, or removed.

Embodiments of the invention and all of the functional operations described in this specification can be implemented in digital electronic circuitry, or in computer software, firmware, or hardware, including the structures disclosed in this specification and their structural equivalents, or in combinations of one or more of them. Embodiments of the invention can be implemented as one or more computer program products, e.g., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

In each instance where an HTML file is mentioned, other file types or formats may be substituted. For instance, an HTML file may be replaced by an XML, JSON, plain text, or other types of files. Moreover, where a table or hash table is mentioned, other data structures (such as spreadsheets, relational databases, or structured files) may be used.

Particular embodiments of the invention have been described. Other embodiments are within the scope of the following claims. For example, the steps recited in the claims can be performed in a different order and still achieve desirable results.

What is claimed is:

1. A system comprising:
 a wearable device comprising:
  a plurality of tunable optical elements; one or more photodetectors configured to receive light reflected from a user of the system and to generate one or more electrical signals based on the received light; and
  one or more processors electrically coupled to the plurality of tunable optical elements and the one or more photodetectors, the one or more processors configured to:
   obtain time-of-flight information corresponding to phase differences between a reference signal and the one or more electrical signals generated by the one or more photodetectors;

determine a depth map of the user that comprises a depth map of an eye of the user based on the time-of-flight information;

determine, based on the depth map of the user, action information that corresponds to an action of the user; and provide one or more outputs for adjusting one or more of the plurality of tunable optical elements based on the action information; and a reference device configured to:

determine a location or a movement of the reference device; and transmit, from the reference device to the wearable device, reference information representing the location or the movement of the reference device, wherein the one or more processors of the wearable device are configured to determine the action information based on the reference information received by the wearable device, in addition to the depth map of the user.

2. The system of claim 1, comprising a display device configured to display an image based on the one or more outputs provided by the one or more processors.

3. The system of claim 2, wherein the image displayed by the display device is controlled by a subset of the plurality of tunable optical elements.

4. The system of claim 2, wherein the display device and the one or more photodetectors are packaged as two separate hardware devices.

5. The system of claim 2, wherein the display device and the one or more photodetectors are packaged as one integrated hardware device.

6. The system of claim 1, wherein the plurality of tunable optical elements comprise tunable lenses or mirrors.

7. The system of claim 1, wherein the action of the user comprises an eye gaze of the user.

8. The system of claim 1, wherein the one or more processors are configured to provide the one or more outputs for adjusting one or more focal lengths of the one or more of the plurality of tunable optical elements.

9. The system of claim 1, wherein the one or more photodetectors are configured to filter the received light to remove a part of wavelengths of the received light.

10. The system of claim 1, wherein the received light is a modulation signal with 50% duty cycle.

11. The system of claim 1, wherein each photodetector of the one or more photodetectors comprises a time-of-flight pixel and two sets of transistors.

12. The system of claim 11, wherein each set of the two sets of transistors comprises a resistor, a source-follower transistor, and a selection transistor.

13. The system of claim 11, wherein the time-of-flight pixel is a dual-switching time-of-flight pixel.

14. The system of claim 11, wherein the time-of-flight pixel is configured to implement a demodulation function by dual-switching transistors.

15. The system of claim 11, wherein the time-of-flight pixel comprises a light-absorption layer including germanium.

16. A tracking method, comprising:

generating, by one or more photodetectors, one or more electrical signals in response to light reflected from a user and received by the one or more photodetectors;

obtaining, by a computing system having one or more processors electrically coupled to a plurality of tunable optical elements and the one or more photodetectors, time-of-flight information corresponding to phase differences between a reference signal and the one or more electrical signals generated by the one or more photodetectors;

determining, by the computing system, a depth map of the user based on the time-of-flight information, the depth map of the user comprising a depth map of an eye of the user;

obtaining, by the computing system, reference information representing a location or a movement of a reference device in communication with the computing system;

determining, by the computing system and based on the depth map and the reference information, action information that corresponds to an action of the user; and providing, by the computing system, one or more outputs for adjusting one or more of the plurality of tunable optical elements based on the action information.

17. The method of claim 16, further comprising:

displaying an image using a display device based on the one or more outputs provided by the one or more processors.

18. The method of claim 17, wherein the image displayed by the display device is controlled by a subset of the plurality of tunable optical elements.

19. The method of claim 17, wherein the display device and the one or more photodetectors are integrated in a hardware package.

20. A system comprising:

a wearable device comprising:

a plurality of tunable optical elements; one or more photodetectors configured to receive light reflected from a user of the system and to generate one or more electrical signals based on the received light; and one or more processors electrically coupled to the plurality of tunable optical elements and the one or more photodetectors, the one or more processors configured to:

obtain time-of-flight information corresponding to phase differences between a reference signal and the one or more electrical signals generated by the one or more photodetectors;

determine a depth map of the user that comprises a depth map of an eye of the user based on the time-of-flight information;

determine, based on the depth map of the user, action information that corresponds to an action of the user; and provide one or more outputs for adjusting one or more of the plurality of tunable optical elements based on the action information; and a reference device configured to:

determine a location or a movement of the reference device; and transmit, from the reference device to the wearable device, reference information representing the location or the movement of the reference device, wherein the one or more processors of the wearable device are configured to determine the action information based on the reference information received by the wearable device, in addition to the depth map of the user.

* * * * *